(12) United States Patent
Xu et al.

(10) Patent No.: US 10,937,890 B2
(45) Date of Patent: Mar. 2, 2021

(54) VERTICAL FIELD-EFFECT TRANSISTOR LATE GATE RECESS PROCESS WITH IMPROVED INTER-LAYER DIELECTRIC PROTECTION

(71) Applicant: International Business Machines Corporation, Armonk, NY (US)

(72) Inventors: Wenyu Xu, Albany, NY (US); Ruilong Xie, Niskayuna, NY (US); Pietro Montanini, Albany, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/373,844

(22) Filed: Apr. 3, 2019

(65) Prior Publication Data

US 2020/0321448 A1    Oct. 8, 2020

(51) Int. Cl.
*H01L 21/82* (2006.01)
*H01L 29/66* (2006.01)
(Continued)

(52) U.S. Cl.
CPC .... *H01L 29/66515* (2013.01); *H01L 21/0217* (2013.01); *H01L 21/02167* (2013.01); *H01L 21/28088* (2013.01); *H01L 21/28512* (2013.01); *H01L 21/31116* (2013.01); *H01L 21/823828* (2013.01); *H01L 21/823871* (2013.01); *H01L 21/823885* (2013.01); *H01L 27/092* (2013.01); *H01L 29/45* (2013.01);
(Continued)

(58) Field of Classification Search
None
See application file for complete search history.

(56) References Cited

U.S. PATENT DOCUMENTS 4,903,089 A    2/1990   Hollis et al.
5,874,760 A    2/1999   Burns, Jr. et al.
(Continued)

OTHER PUBLICATIONS

"Method and Structure for Self-Aligned Buried Silicide and Metal Plate Connection" Disclosed Anonymously, IPCOM000255753D Oct. 12, 2018.

*Primary Examiner* — Benjamin P Sandvik
(74) *Attorney, Agent, or Firm* — Fleit Intellectual Property Law; Jose Gutman

(57) ABSTRACT

A method for forming a semiconductor device is disclosed. The method includes receiving a substrate stack including at least one semiconductor fin, the substrate stack including: a bottom source/drain epi region directly below the semiconductor fin; a vertical gate structure directly above the bottom source/drain epi region and in contact with the semiconductor fin; a first inter-layer dielectric in contact with a sidewall of the vertical gate structure; and a second interlayer-layer dielectric directly above and contacting a top surface of the first inter-layer dielectric. The method further including: etching a top region of the semiconductor fin and the gate structure thereby creating a recess directly above the top region of the semiconductor fin and the vertical gate structure; and forming in the recess a top source/drain epi region directly above, and contacting, a top surface of the semiconductor fin. A novel semiconductor device structure is also disclosed.

8 Claims, 18 Drawing Sheets

(51) Int. Cl.

| | |
|---|---|
| *H01L 29/78* | (2006.01) |
| *H01L 21/02* | (2006.01) |
| *H01L 21/28* | (2006.01) |
| *H01L 21/285* | (2006.01) |
| *H01L 21/311* | (2006.01) |
| *H01L 21/8238* | (2006.01) |
| *H01L 27/092* | (2006.01) |
| *H01L 29/45* | (2006.01) |
| *H01L 29/49* | (2006.01) |

(52) U.S. Cl.
CPC .... *H01L 29/4966* (2013.01); *H01L 29/66553* (2013.01); *H01L 29/66666* (2013.01); *H01L 29/7827* (2013.01)

(56) References Cited

U.S. PATENT DOCUMENTS

| | | |
|---|---|---|
| 6,034,389 A | 3/2000 | Burns, Jr. et al. |
| 6,689,650 B2 | 2/2004 | Gambino et al. |
| 9,431,305 B1 | 8/2016 | Anderson et al. |
| 9,530,863 B1* | 12/2016 | Zhang ............... H01L 29/66666 |
| 10,319,836 B1* | 6/2019 | Reznicek ............ H01L 21/0245 |
| 2015/0187867 A1 | 7/2015 | Basker et al. |
| 2018/0090388 A1 | 3/2018 | Anderson et al. |
| 2018/0090593 A1 | 3/2018 | Cheng et al. |
| 2018/0158948 A1 | 6/2018 | Leobandung |
| 2018/0204951 A1* | 7/2018 | Cheng ................. H01L 29/7827 |
| 2018/0254330 A1 | 9/2018 | Bao et al. |
| 2018/0358452 A1* | 12/2018 | Qi .................... H01L 29/78618 |
| 2019/0326165 A1* | 10/2019 | Xie ................... H01L 21/76816 |
| 2020/0006528 A1* | 1/2020 | Cheng ............... H01L 29/66666 |

\* cited by examiner

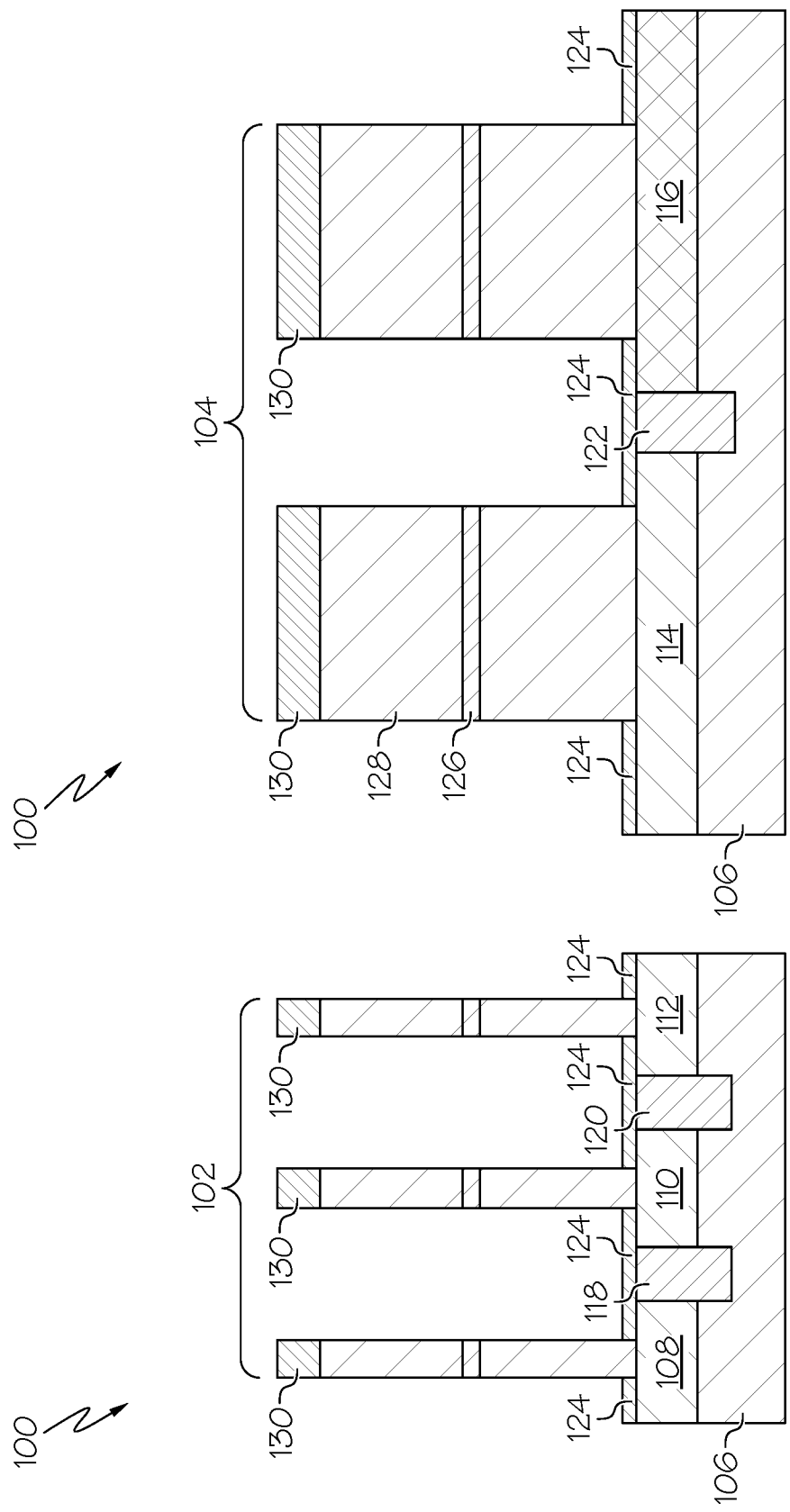

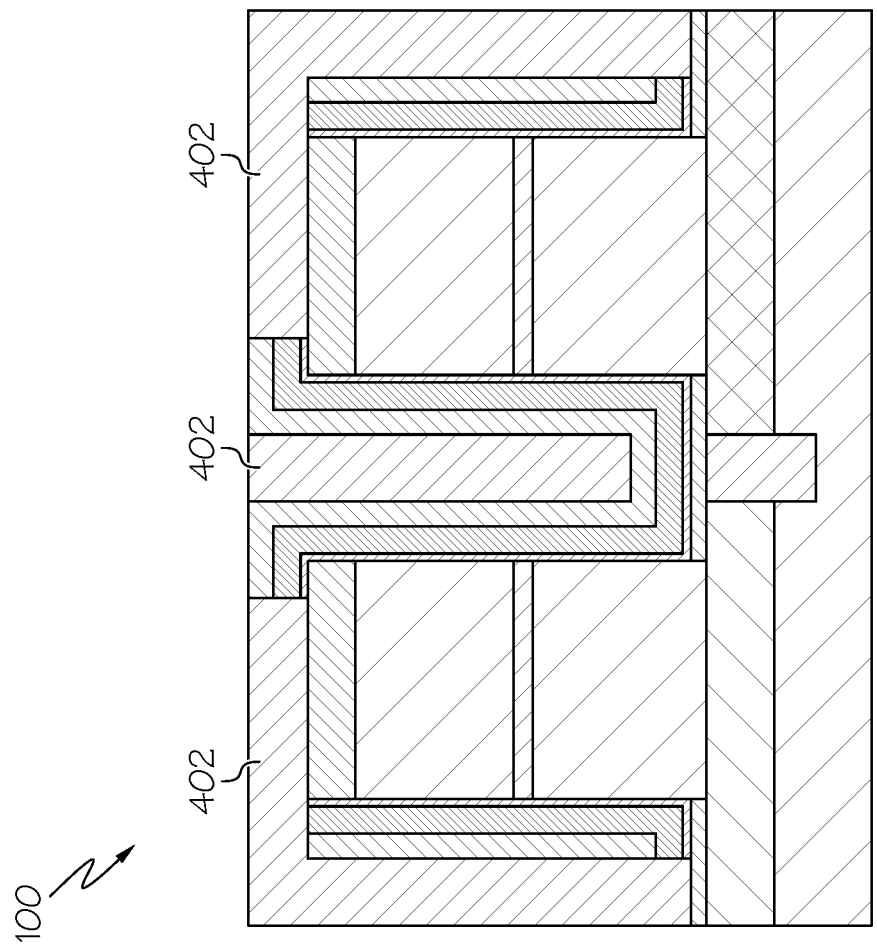
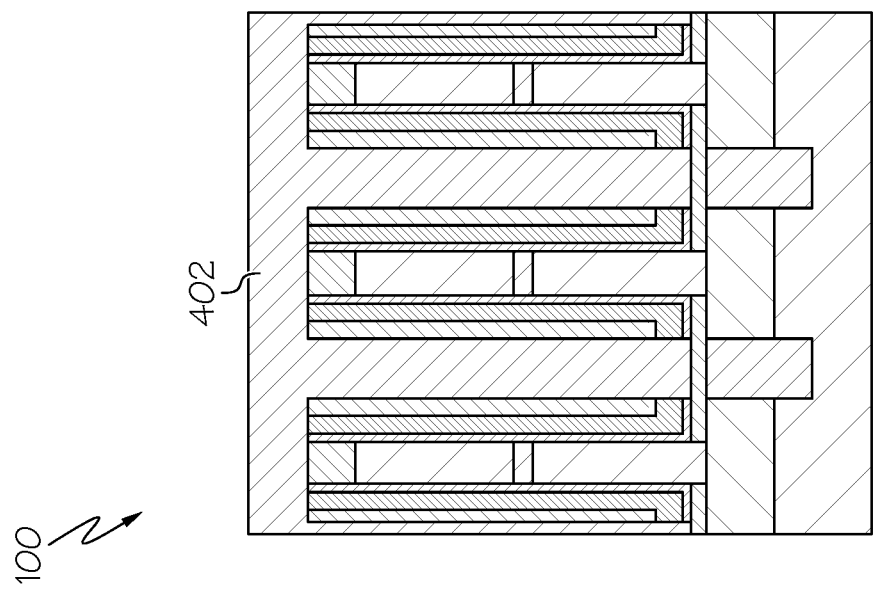
FIG. 5B
FIG. 5A

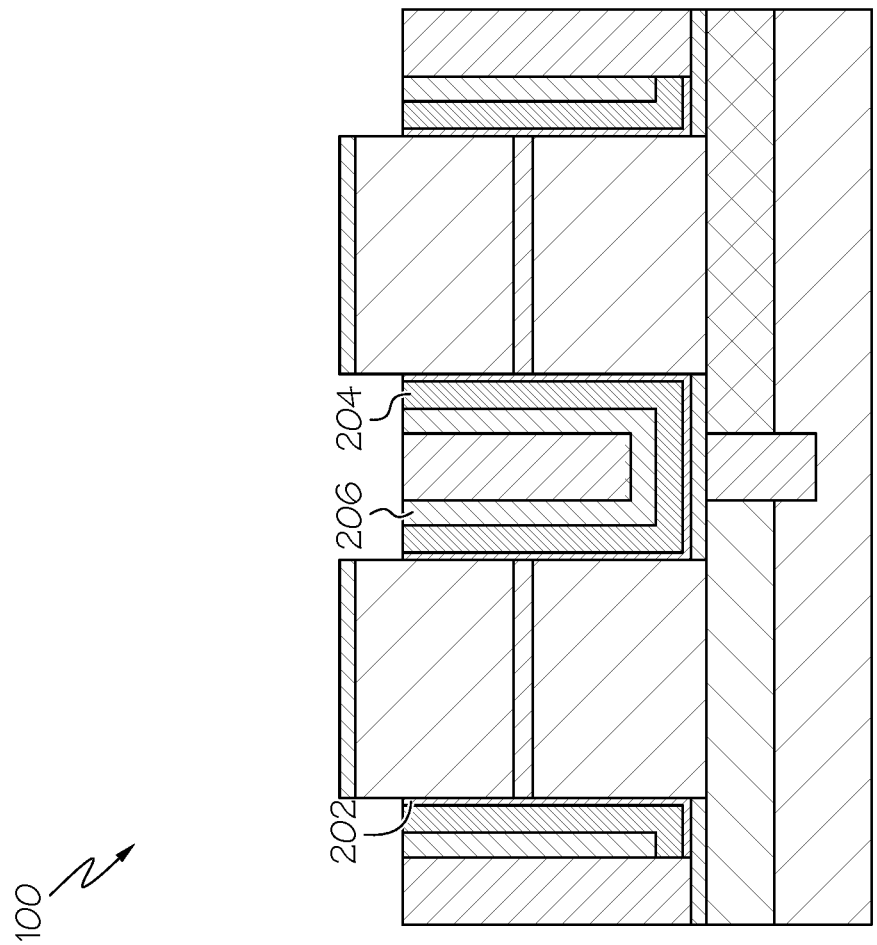
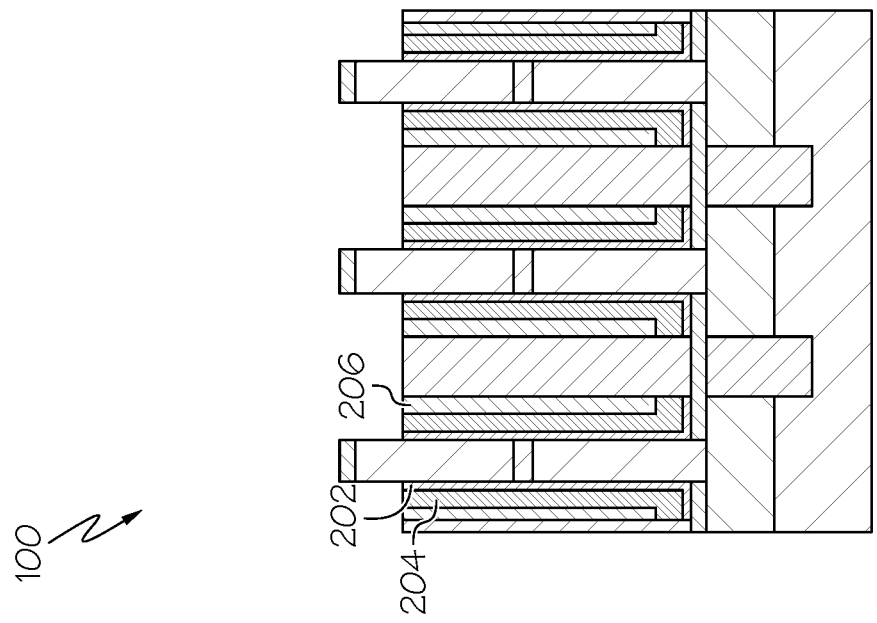
FIG. 7B
FIG. 7A

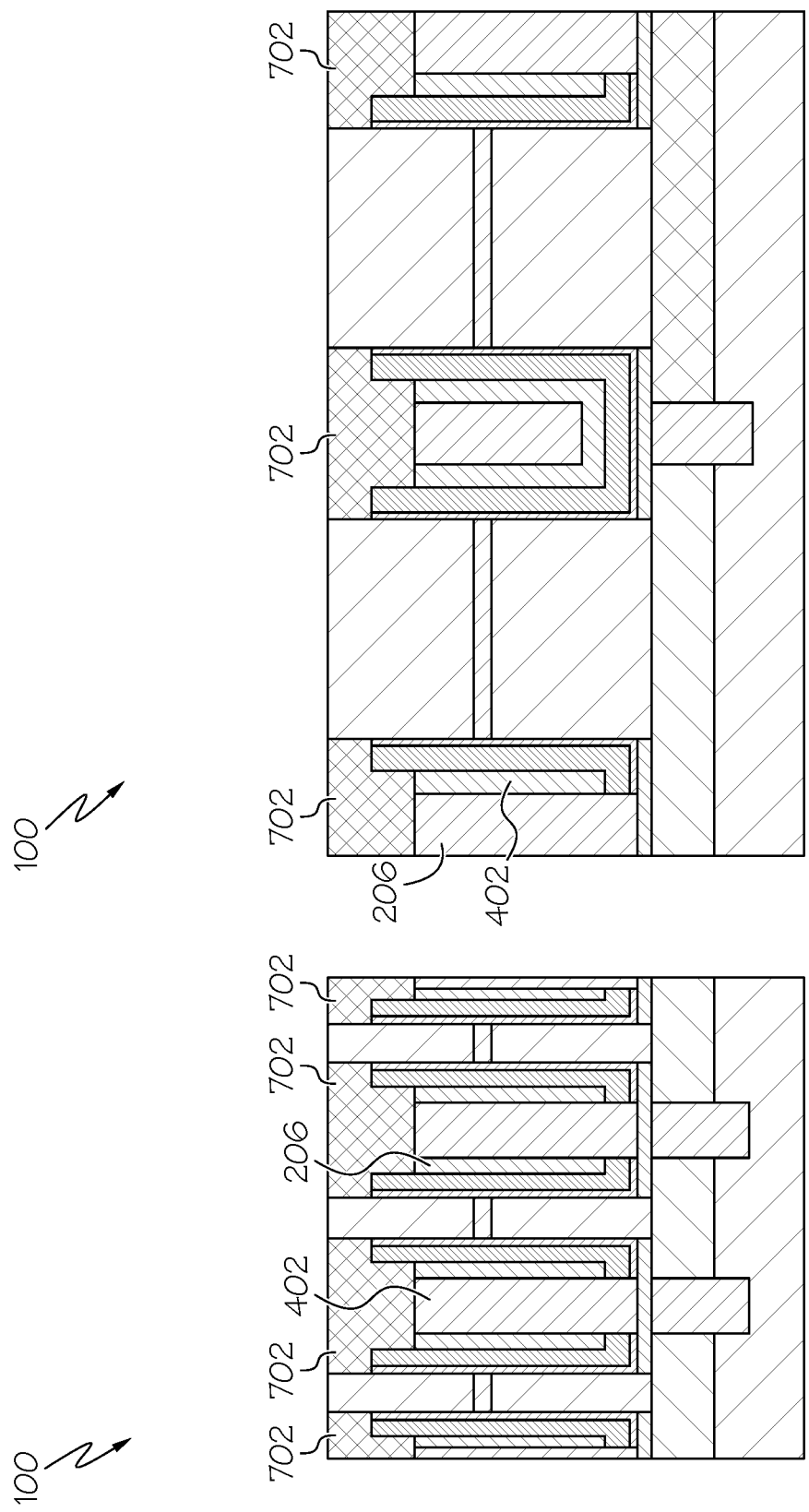

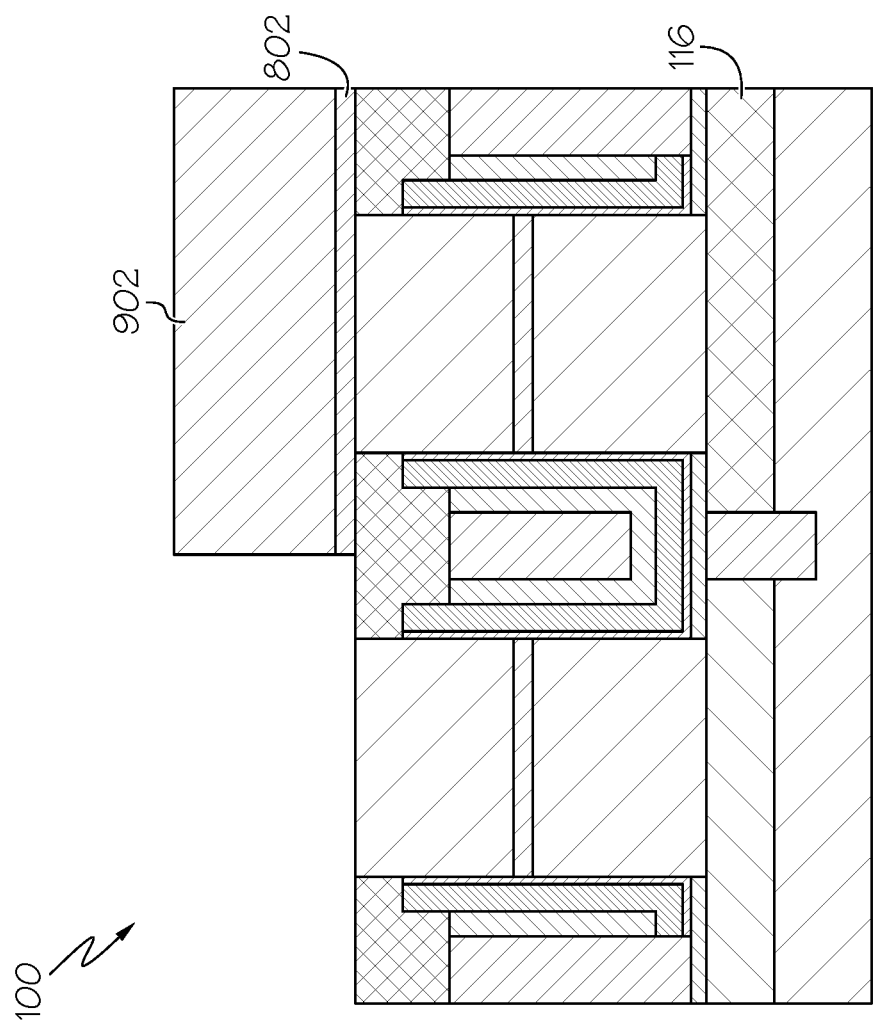
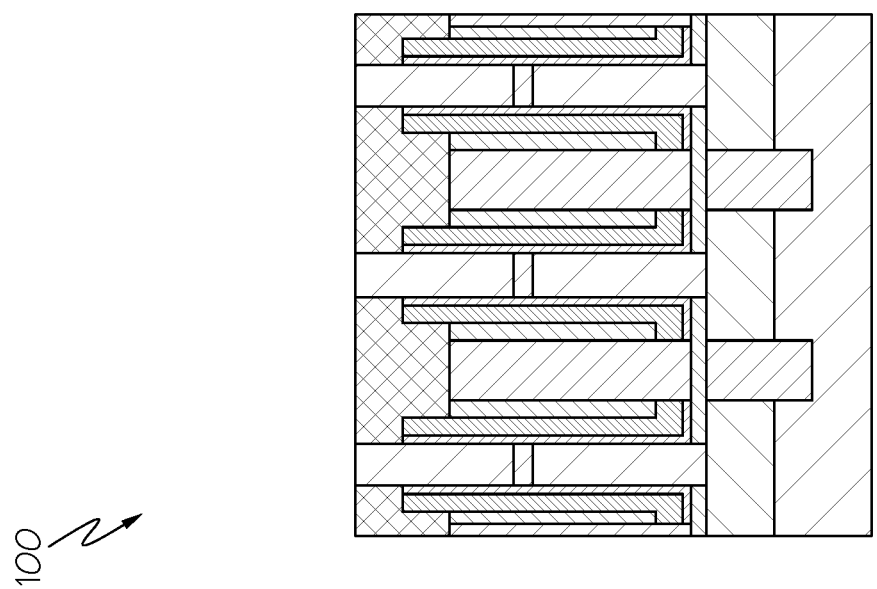
FIG. 10B
FIG. 10A

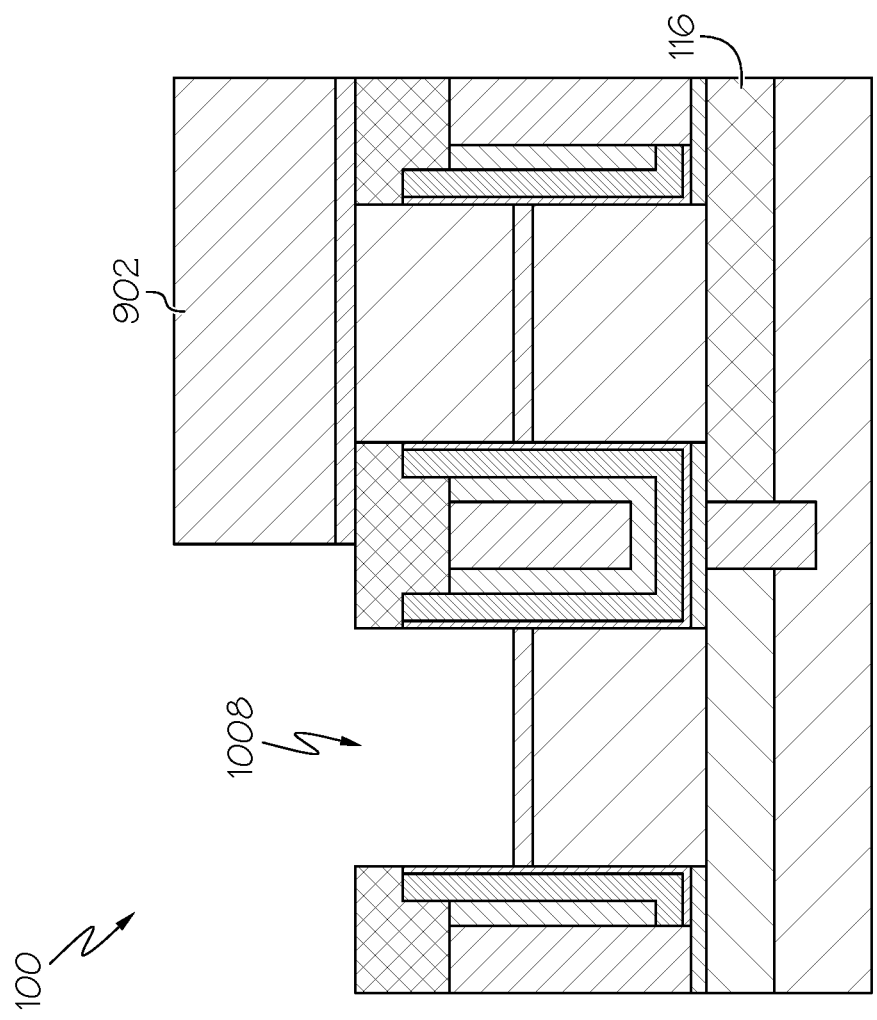
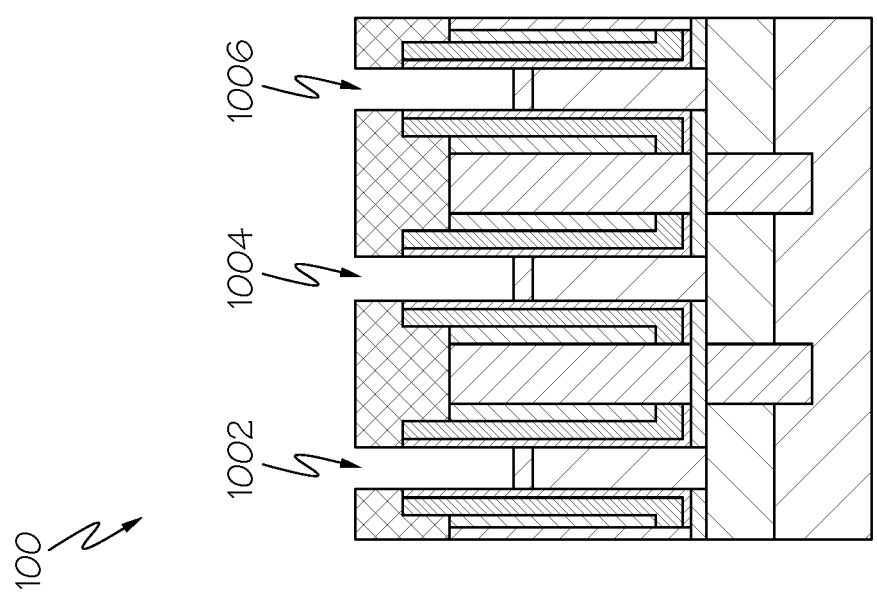
FIG. 11B
FIG. 11A

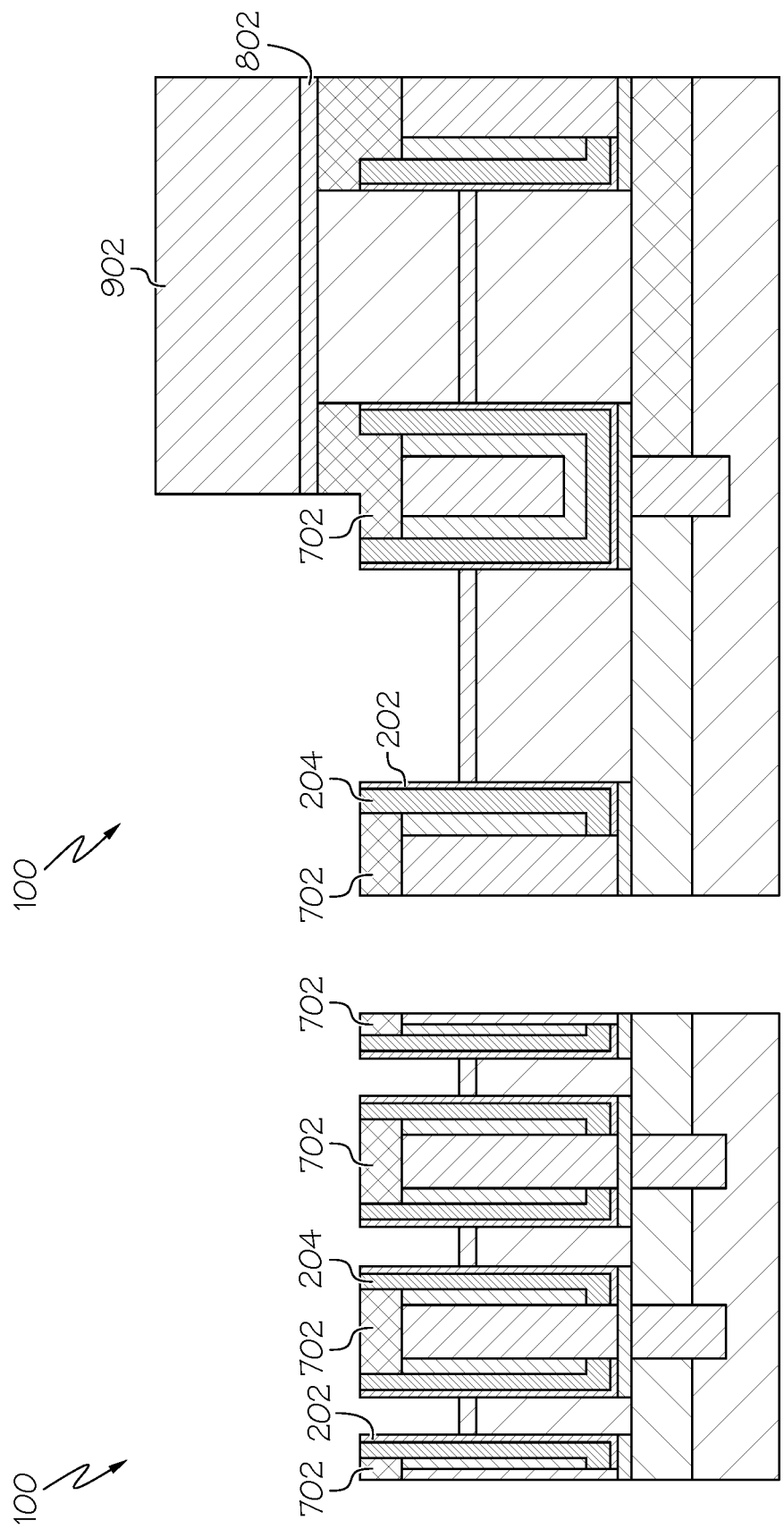

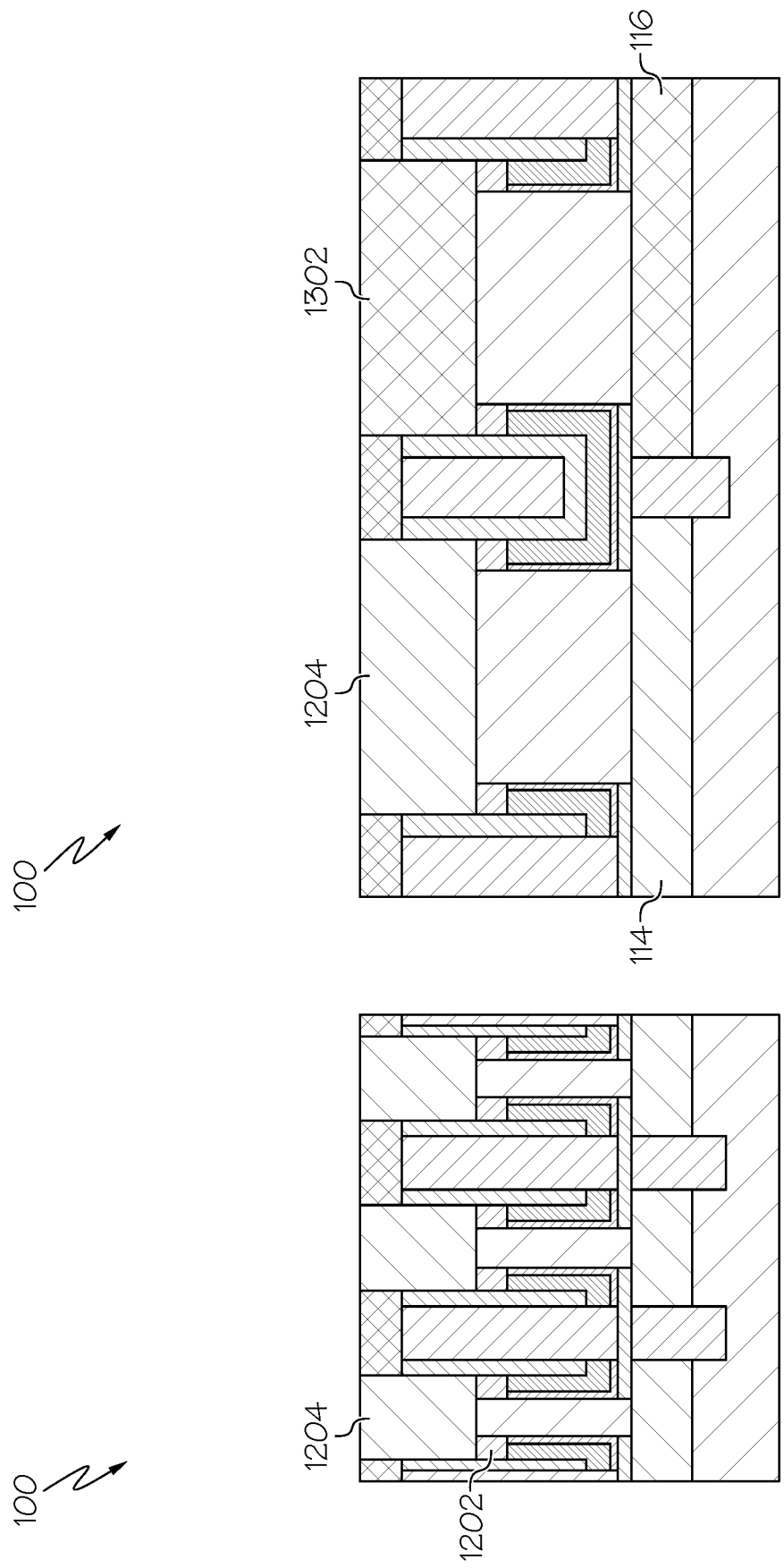

VERTICAL FIELD-EFFECT TRANSISTOR LATE GATE RECESS PROCESS WITH IMPROVED INTER-LAYER DIELECTRIC PROTECTION

BACKGROUND OF THE INVENTION

The present invention generally relates to fabrication of vertical field-effect transistors (VFET) in semiconductor devices, and more particular relates to a fabrication method that includes a late gate recess process.

Vertical field effect transistors (VFETs) are becoming viable device options for semiconductor devices, for example, complementary metal oxide semiconductor (CMOS) devices, beyond 5 nanometer (nm) nodes. VFET devices include vertical fin channels with source/drain regions at ends of the fin channels on top and bottom sides of the fins. A gate region is formed laterally along the vertical fin between a bottom source/drain region and a top source/drain region of the VFET. Current runs through the fin channels in a vertical direction (e.g., perpendicular to a substrate), for example, from a bottom source/drain region to a top source/drain region. A bottom spacer separates a bottom source/drain region from a gate region. A top spacer separates a top source/drain region from the gate region.

Vertical transport architecture devices are designed to extend the product value proposition beyond conventional plateaus and address the limitations of horizontal device architectures by, for example, decoupling of gate length from the contact gate pitch. Vertical transistors may provide higher density scaling and allow for relaxed gate lengths to better control device electrostatics, without sacrificing the gate contact pitch size.

In current VFET fabrication methods, a late gate recess fabrication process may be used to etch back a gate stack to the target gate length after inter-layer dielectric (ILD) is filled between fins, which mainly includes depositing gate stack, depositing protection liner, filling ILD between fins, removing hard mask above fins, recessing gate stack to target gate length, forming top spacer within cavity above gate stack, forming top source/drain epi region, forming top metal contact and any other related steps towards the top portion of a VFET. The inter-layer dielectric (ILD), which typically separates adjacent vertical fins of VFETs on a substrate, can have a very small critical dimension, e.g., in the range of unit nanometers, separating adjacent VFET devices. For example, an ILD could have a critical dimension as low as four (4) nanometers separating two nearby fins of VFETs. This small critical dimension for an ILD, the inventors have discovered, has a higher erosion rate during top spacer etch back process. Such etch back process can be part of a late gate recess (LGR) process, used while forming a top spacer for VFETs. A top spacer etch back process can cause strong erosion of a small critical dimension of an ILD fang separating adjacent (or nearby) fins of VFETs on a substrate. This type of erosion can cause serious fabrication defects, such as causing a short circuit between a top source/drain epi region and an adjacent metal contact used in fabricating VFET semiconductor device.

SUMMARY OF THE INVENTION

In one embodiment, a method for forming a semiconductor device is disclosed. The method includes receiving a substrate stack including at least one semiconductor fin, the substrate stack including: a bottom source/drain epi region directly below the semiconductor fin; a vertical gate structure directly above the bottom source/drain epi region and in contact with the semiconductor fin; a first inter-layer dielectric in contact with a sidewall of the vertical gate structure; and a second interlayer-layer dielectric directly above and contacting a top surface of the first inter-layer dielectric. The method further including: etching a top region of the semiconductor fin and the gate structure thereby creating a recess directly above the top region of the semiconductor fin and the vertical gate structure; and forming in the recess at least a top source/drain epi region directly above, and contacting, a top surface of the semiconductor fin.

In another embodiment, a semiconductor device structure is disclosed. The semiconductor device structure comprises: a substrate stack including at least one semiconductor fin, the substrate stack including: a bottom source/drain epi region directly below the semiconductor fin; a vertical gate structure directly above the bottom source/drain epi region and in contact with the semiconductor fin; a top source/drain epi region directly above, and contacting, a top surface of the semiconductor fin and a top surface of the vertical gate structure; a first inter-layer dielectric in contact with a sidewall of the vertical gate structure; and a second inter-layer-layer dielectric directly above and contacting a top surface of the first inter-layer dielectric. Optionally, the second inter-layer dielectric can contact a sidewall of the vertical gate structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 2A is a cross-sectional side view of a semiconductor structure comprising six vertical fins at a step in a semiconductor fabrication method, the view indicated by A-A in FIG. 1, according to one example of the present invention;

FIG. 2B is a cross-sectional side view of the semiconductor structure comprising six vertical fins at the step in the semiconductor fabrication method, the view indicated by B-B in FIG. 1, according to the one example of the present invention;

FIG. 5A is a cross-sectional side view of the semiconductor structure at a subsequent step in the semiconductor fabrication method;

FIG. 5B is a cross-sectional side view of the semiconductor structure at the same subsequent step in the semiconductor fabrication method as in FIG. 5A;

FIG. 7A is a cross-sectional side view of the semiconductor structure at a subsequent step in the semiconductor fabrication method;

FIG. 7B is a cross-sectional side view of the semiconductor structure at the same subsequent step in the semiconductor fabrication method as in FIG. 7A;

FIG. 8A is a cross-sectional side view of the semiconductor structure at a subsequent step in the semiconductor fabrication method;

FIG. 8B is a cross-sectional side view of the semiconductor structure at the same subsequent step in the semiconductor fabrication method as in FIG. 8A;

FIG. 10A is a cross-sectional side view of the semiconductor structure at a subsequent step in the semiconductor fabrication method;

FIG. 10B is a cross-sectional side view of the semiconductor structure at the same subsequent step in the semiconductor fabrication method as in FIG. 10A;

FIG. 11A is a cross-sectional side view of the semiconductor structure at a subsequent step in the semiconductor fabrication method;

FIG. 11B is a cross-sectional side view of the semiconductor structure at the same subsequent step in the semiconductor fabrication method as in FIG. 11A;

FIG. 12A is a cross-sectional side view of the semiconductor structure at a subsequent step in the semiconductor fabrication method;

FIG. 12B is a cross-sectional side view of the semiconductor structure at the same subsequent step in the semiconductor fabrication method as in FIG. 12A;

FIG. 14A is a cross-sectional side view of the semiconductor structure at a subsequent step in the semiconductor fabrication method, according to the one embodiment of the invention;

FIG. 14B is a cross-sectional side view of the semiconductor structure at the same subsequent step in the semiconductor fabrication method as in FIG. 14A;

DETAILED DESCRIPTION

Figure 1:
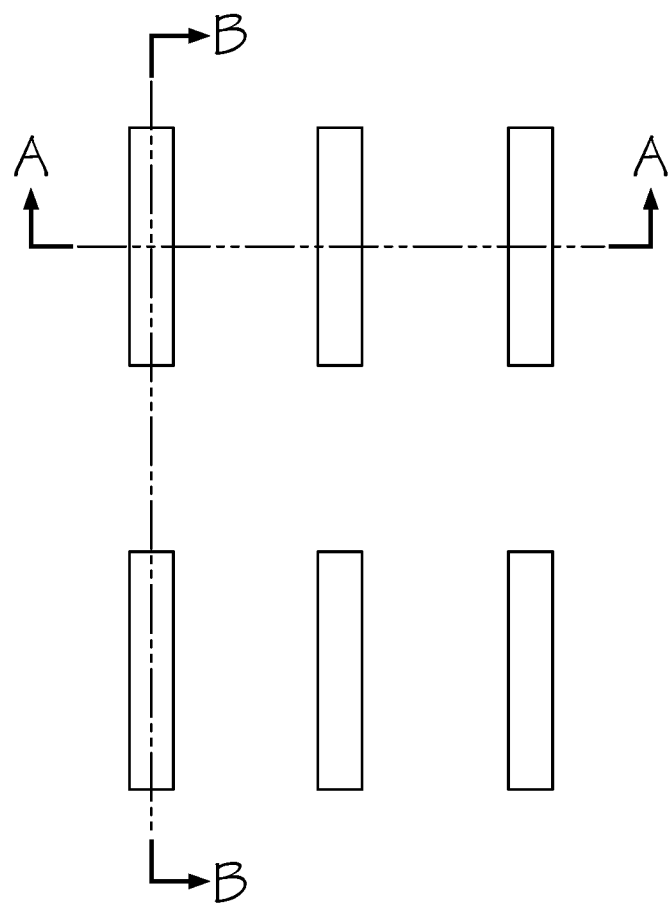
FIG. 1 is a top schematic view of a semiconductor structure comprising six vertical fins nearby each other in a two row by three column arrangement of the vertical fins on a semiconductor substrate. Cross sectional views A-A (cross-fin cut) and B-B (long fin cut) are indicated to provide guidance for viewing the subsequent pairs of figures in which a first figure number ending with a letter "A" corresponds to the view A-A indicated in FIG. 1 while the second figure number ending with a letter "B" corresponds to the view B-B indicated in FIG. 1, each pair of figures illustrates two views of a step in a semiconductor fabrication method according to one example of the present invention.

It is to be understood that the various layers and/or regions shown in the accompanying drawings are not drawn to scale, and that one or more layers and/or regions of a type commonly used in metal-oxide semiconductor (MOS) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention may be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

As used herein, "vertical" refers to a direction perpendicular to a substrate in the views herein. As used herein, "horizontal" refers to a direction parallel to a substrate views herein. As used herein, "thickness" refers to a size of an element (e.g., a layer, trench, hole, etc.) in the cross-sectional views measured from a bottom surface to a top surface, or a left side surface to a right side surface of the element, and/or measured with respect to a surface on which the element is directly on.

Unless otherwise specified, as used herein, "height" or "height above a substrate" refers to a vertical size of an element (e.g., a layer, trench, hole, etc.) in the cross-sectional views measured from a top surface of the substrate to a top surface of the element. A thickness of an element can be equal to a height of the element if the element is directly on the substrate. As used herein, "lateral", "lateral side", and "lateral surface", and the like, refer to a side surface of an element (e.g., a layer, an opening, a fin, etc.), such as a left or right side surface in the cross-sectional views herein.

As used herein, the terms "width" or "width value", and the like, refer to a distance from a start point on a first structure to an end point on the same structure, in a critical dimension. There can be specified a vertical width (e.g., a thickness) of the structure or a horizontal width of the structure.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present invention may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), fin field-effect transistor (finFET), metal-oxide-semiconductor field-effect transistor (MOSFET), and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

Deposition may be by any process that grows, coats, or otherwise transfers a material onto the wafer. Available technologies include, for example, physical vapor deposition (PVD), chemical vapor deposition (CVD), electrochemical deposition (ECD), molecular beam epitaxy (MBE) and more recently, atomic layer deposition (ALD) among others.

The terms "epitaxially growing", "epitaxial growth", "epitaxially grown", and their variants, mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a combination thereof, and/or the like. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof.

Removal may be by any process that removes material from the wafer; examples include etch processes (either wet or dry), reactive ion etching (RIE), and chemical-mechanical planarization (CMP).

Patterning refers to the shaping or altering of deposited materials, and can be generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist can be removed by plasma ashing.

Modification of electrical properties has historically entailed doping transistor sources and drains (originally by diffusion furnaces and later by ion implantation). These doping processes are followed by furnace annealing or, in advanced devices, by rapid thermal annealing (RTA); annealing serves to activate the implanted dopants. Modification of electrical properties now also extends to the reduction of a material's dielectric constant in low-k insulators trench exposure to ultraviolet light in UV processing (UVP). Modification is frequently achieved by oxidation, which can be carried out to create semiconductor-insulator junctions, such as in the local oxidation of silicon (LOCOS) to fabricate metal oxide field effect transistors.

Various embodiments will now be discussed in further detail with regard to semiconductor devices and methods of manufacturing the same and, in particular, to a fabrication method and structure of a vertical field-effect transistor (VFET) semiconductor device with a top portion of an inter-layer dielectric (ILD) that, according to various embodiments, is a thicker and stronger single dielectric material (e.g., SiC) disposed on top of a bottom portion of the ILD, which can be a material (e.g., silicon oxide) different from the top portion.

A late gate recess (LGR) process, such as one that uses RIE to etch a top spacer region and a top source/drain region on a vertical fin of a VFET, will significantly benefit from the thicker and stronger single dielectric material (e.g., SiC) of a top portion of an ILD between two nearby fins. Additionally, according to various embodiments, selection of a placement location for a source/drain metal contact and/or a gate metal contact for a VFET can be more flexible relative to the location of an active region of a fin structure of a VFET. For example, placement of a gate metal contact for a VFET can be located over the active region of a fin structure of the VFET. Previously, a gate metal contact for a VFET had to be located away from the active region of a fin structure of the VFET. The gate metal contact for a VFET would be placed at the end of a fin structure. Placement of the gate metal contact would be restricted from a location adjacent to and in between the fins of VFET devices. Moreover, the height of a VFET cell was made very tall by placing a gate metal contact at the end of a fin structure and away from the active region of the fin structure. According to various embodiments the location of the gate metal contact close to, or over, the active region of the fin structure of the VFET also allows for reduced cell height. This is a more efficient use of the semiconductor real estate, in the vertical direction, as needed for each cell.

The inventors have observed that with a very small unit nanometer critical dimension of an ILD between two nearby fins, a RIE to etch a top spacer region and a top source/drain region of a VFET could easily damage an ILD oxide material. This could result in shorts being created, such as between metal contacts of VFETs and adjacent structures. According to various embodiments, ILD oxide material can be recessed and filled with a different dielectric material such as silicon carbide (SiC) which provides selectivity to oxide. In order to be more compatible with an LGR process and with self-aligned gate patterning, a hard mask for a vertical fin can include an amorphous silicon and silicon nitride (aSi/SiN) bi-layer.

Referring now to the drawings in which like numerals represent the same or similar elements, FIG. 1 shows a top schematic view of a semiconductor structure comprising six vertical fins nearby each other in a two row by three column arrangement of the vertical fins on a semiconductor substrate. Cross sectional views A-A and B-B are indicated to provide guidance for viewing the subsequent pairs of FIGS. 2A and 2B up to 17A and 17B, in which a first figure number ending with a letter "A" corresponds to the view A-A indicated in FIG. 1 while the second figure number ending with a letter "B" corresponds to the view B-B indicated in FIG. 1. Each pair of figures illustrates two views of a step in a semiconductor fabrication method according to one example of the present invention.

FIGS. 2A and 2B show a cross-sectional side view of a semiconductor structure 100 comprising six vertical fins (102, 104) formed on a substrate 106, at a step in a semiconductor fabrication method, according to one example of the present invention. The set of six vertical fins 102, as shown in FIG. 2A, are shown corresponding to the view A-A indicated in FIG. 1, and the same set of fins 104, as shown in FIG. 2B, are shown corresponding to the view B-B indicated in FIG. 1.

The substrate 106, according to one embodiment, may be a bulk substrate comprising silicon (Si). The substrate 106 can include a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. III-V compound semiconductors may have a composition defined by the formula $Al_{x1}Ga_{x2}In_{x3}As_{y1}P_{y2}N_{y3}Sb_{y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). II-VI compound semiconductors may have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In addition, multiple layers of semiconductor materials can be used as the semiconductor material of the substrate 106. In some embodiments, the substrate 106 includes both semiconductor materials and dielectric materials. The semiconductor substrate 106 may also comprise an organic semiconductor or a layered semiconductor such as, for example, Si/SiGe, a silicon-on-insulator or a SiGe-on-insulator. The semiconductor substrate 106 may be doped, undoped or contain doped regions and undoped regions therein. The semiconductor substrate 106 may contain regions with strain and regions without strain therein, or contain regions of tensile strain and compressive strain.

The semiconductor structure 100 further comprises a bottom source/drain epi (epitaxially grown) layer 108, 110, 112, 114, 116, formed directly above the substrate 106. In one example, the bottom source/drain epi layer 108, 110, 112, 114, 116, includes a bottom junction for a VFET, e.g., a bottom source/drain epi region, 108, 110, 112, 114, 116, being disposed at least partially directly below a respective vertical fin 102, 104, in the structure 100. The bottom source/drain epi region 108, 110, 112, 114, 116, of each VFET is separated from adjacent (nearby) VFET bottom source/drain epi regions 108, 110, 112, 114, 116, by shallow trench isolation (STI) material 118, 120, 122. Additionally, a bottom spacer layer (bottom spacer) 124 includes a bottom spacer 124 formed directly above, and contacting, a respective bottom junction, or bottom source/drain epi region, 108, 110, 112, 114, 116, of each VFET. The bottom spacer 124 may also be referred to as a bottom gate spacer, which isolates a respective gate region from the bottom source/drain epi region 108, 110, 112, 114, 116, of each VFET. The bottom spacer 124 may be formed by depositing a conformal dielectric material layer on the bottom source/drain epi region 108, 110, 112, 114, 116, and anisotropically etching the conformal dielectric material layer. The conformal dielectric material layer 124 may include, for example, silicon nitride, silicon oxide, and/or dielectric metal oxide. An anisotropic etch process may be employed to anisotropically etch horizontal portions of the conformal dielectric material layer.

Each of the vertical fins 102, 104, according to the example, are formed including a hard mask for patterning, where the hard mask includes a silicon oxide ($SiO_2$) layer 126, an amorphous silicon (a-Si) layer 128 formed directly on, and contacting, the $SiO_2$ layer 126, and a silicon nitride (SiN) layer 130 formed directly on, and contacting, the a-Si layer 128.

Figure 3B:
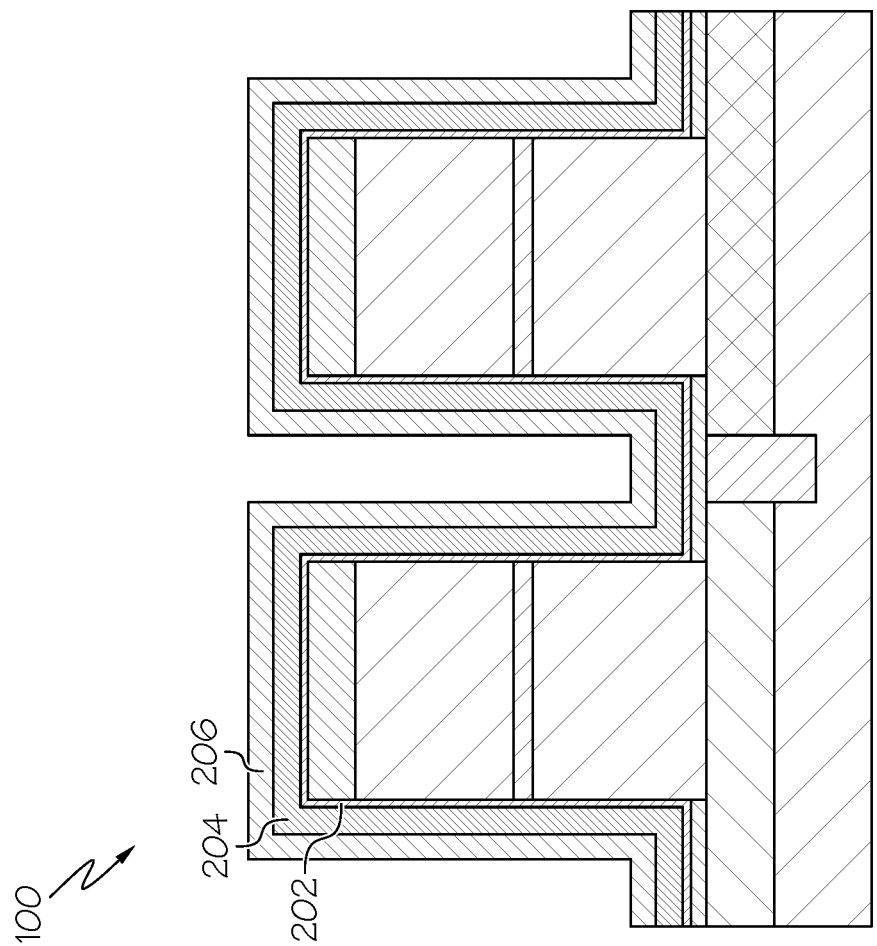
FIG. 3B is a cross-sectional side view of the semiconductor structure at the same subsequent step in the semiconductor fabrication method as in FIG. 3A.
Figure 3A:
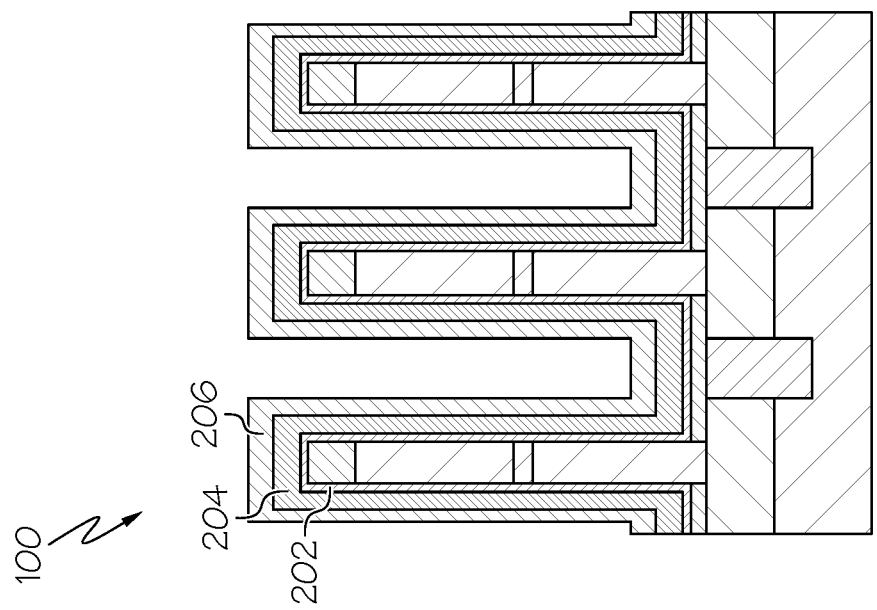
FIG. 3A is a cross-sectional side view of the semiconductor structure at a subsequent step in the semiconductor fabrication method.

As shown in FIGS. 3A and 3B, continuing with the example method, a layer of hafnium oxide ($HfO_2$) 202 (which is a high-K dielectric material) is deposited on the SiN 124, 130, and covers the fins 102, 104, and which is followed by depositing a layer of work function metal (WFM), and then by a layer of silicon nitride 206.

Figure 4B:
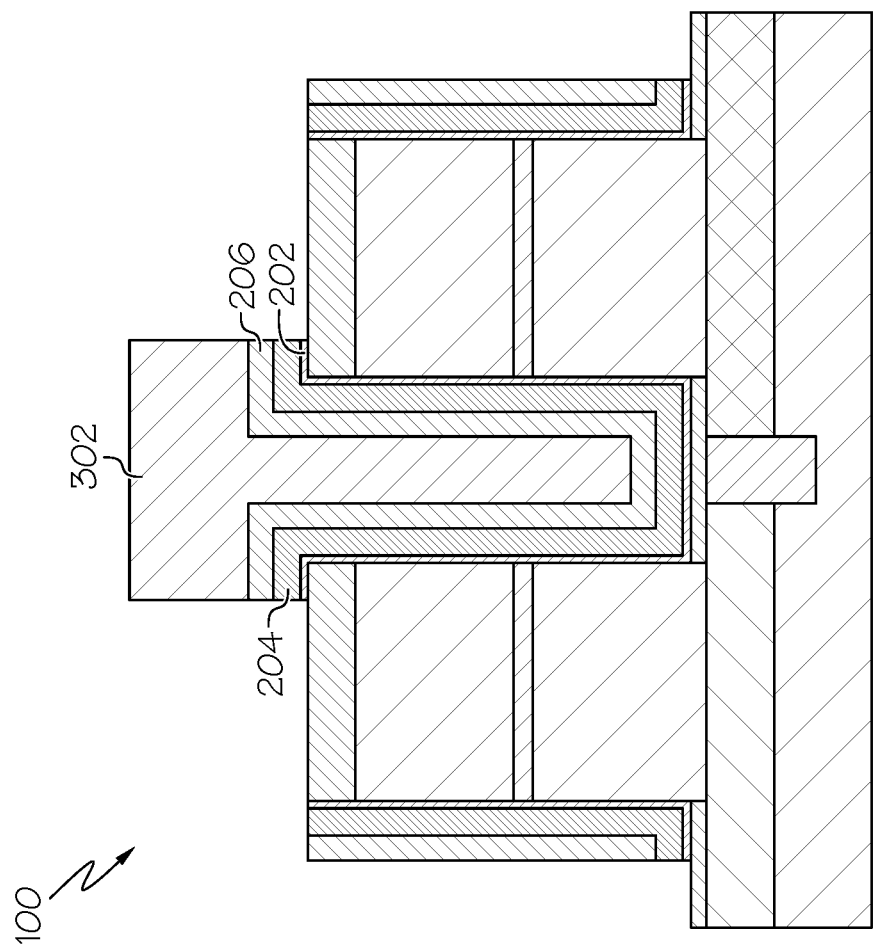
FIG. 4B is a cross-sectional side view of the semiconductor structure at the same subsequent step in the semiconductor fabrication method as in FIG. 4A.
Figure 4A:
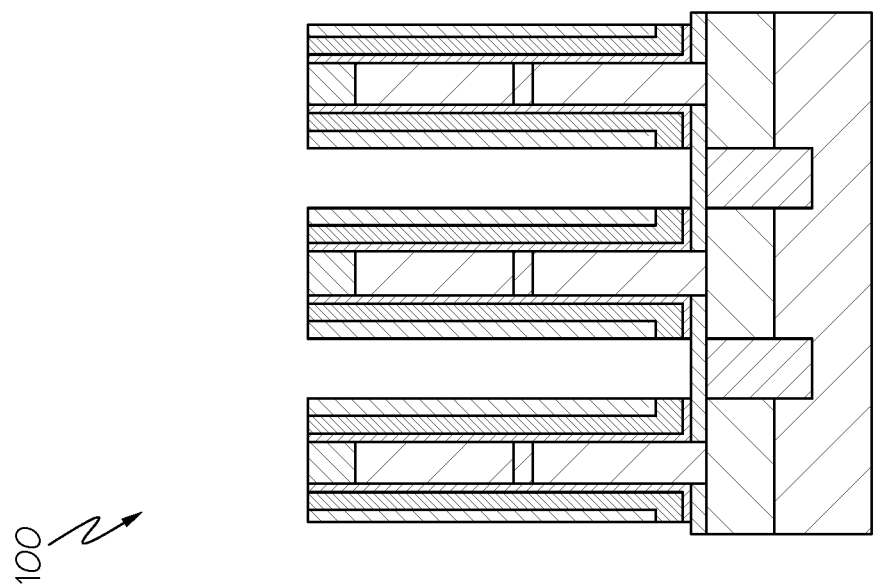
FIG. 4A is a cross-sectional side view of the semiconductor structure at a subsequent step in the semiconductor fabrication method.

Referring to FIGS. 4A and 4B, the example method performs gate patterning etch, such as using reactive ion etching (RIE), to cut a region at a bottom of a fin, as best viewed by comparing FIG. 4A to FIG. 3A, where a gate metal contact will land at the bottom end of the fin and directly contact the work function metal 204. The rest of the region is a self-aligned etch. In FIG. 4B is shown a lithographically defined gate cut mask 302 used, made out of an organic planarization layer (OPL) in this example, for protecting a bottom portion of a fin 102, 104, from removal of the high-K dielectric $HfO_2$ layer 202, the WFM layer 204, and the protective SiN layer 206, during a gate cut patterning etch of the fins 102, 104. Later on in a semiconductor fabrication process, a gate metal contact can be patterned at the specific region to extend adjacent to the fin 102, 104, from a top portion of the fin 102, 104, to a bottom portion of the fin 102, 104, to land on, and make electrical contact with, the WFM 204 at the bottom of the fin 102, 104.

Referring to FIGS. 5A and 5B, the example method performs an oxide (e.g., $SiO_2$) fill deposition of oxide 402 over the fins 102, 104. This oxide 402 provides insulating dielectric material for a first ILD separating the fins 102, 104.

Figure 6B:
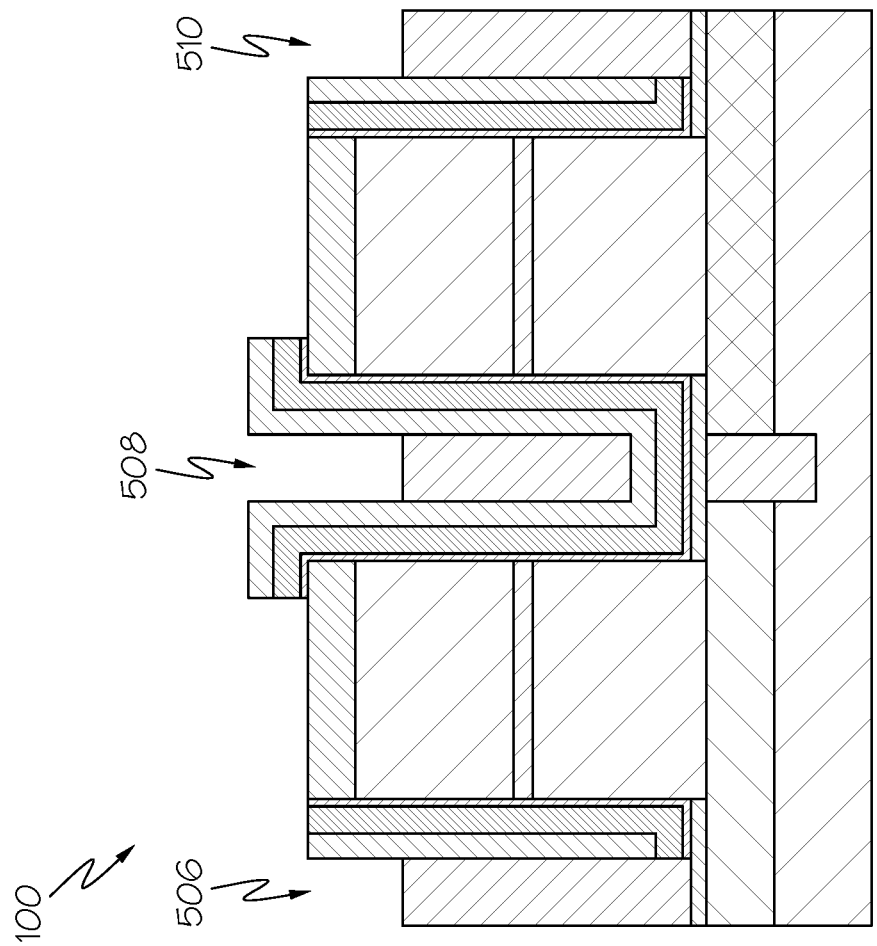
FIG. 6B is a cross-sectional side view of the semiconductor structure at the same subsequent step in the semiconductor fabrication method as in FIG. 6A.
Figure 6A:
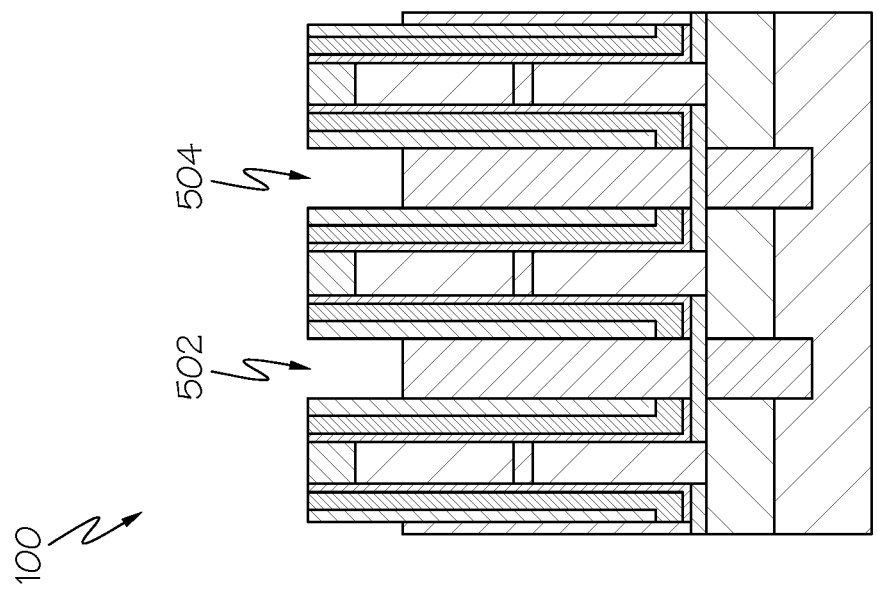
FIG. 6A is a cross-sectional side view of the semiconductor structure at a subsequent step in the semiconductor fabrication method.

Then, as shown in FIGS. 6A and 6B, a shallow oxide etch is performed on the oxide 402 to create recesses 502, 504, 506, 508, 510, in the oxide 402. This removes the oxide 402 down to a level within a region of the top a-Si 128 hard mask of the fin 102, 104. Following the shallow oxide etch, according to the example, an isotropic silicon oxide etch is performed, as shown in FIG. 7A and FIG. 7B, to remove the exposed protective SiN 206, followed by the WFM 204, and then by the high-K dielectric $HfO_2$ 202, from the top and sides of the fins 102, 104, down to the height of the recessed oxide 402. Then, as shown in FIG. 8A and FIG. 8B, additional oxide and SiN recess is performed by the example fabrication method, followed by a silicon carbide (SiC) fill on top of the recessed oxide. Then, a CMP process is performed to remove excess SiC and expose the top of the a-Si 128 of the fin hard mask on the fin 102, 104.

Figure 9B:
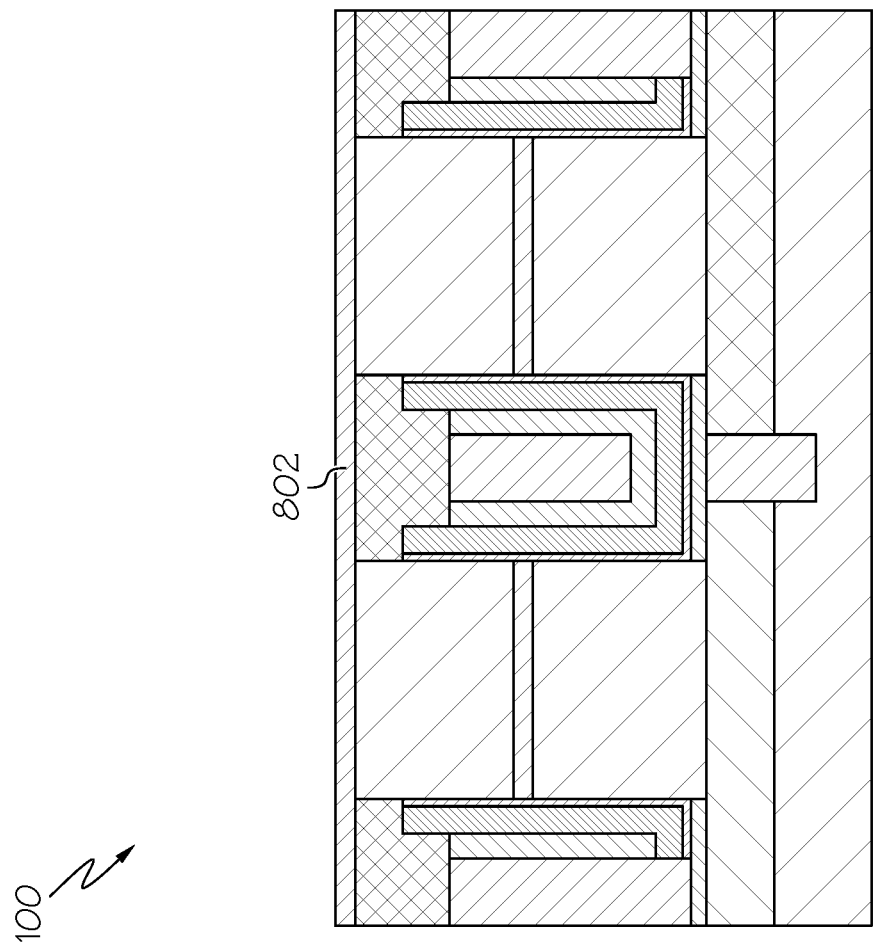
FIG. 9B is a cross-sectional side view of the semiconductor structure at the same subsequent step in the semiconductor fabrication method as in FIG. 9A.
Figure 9A:
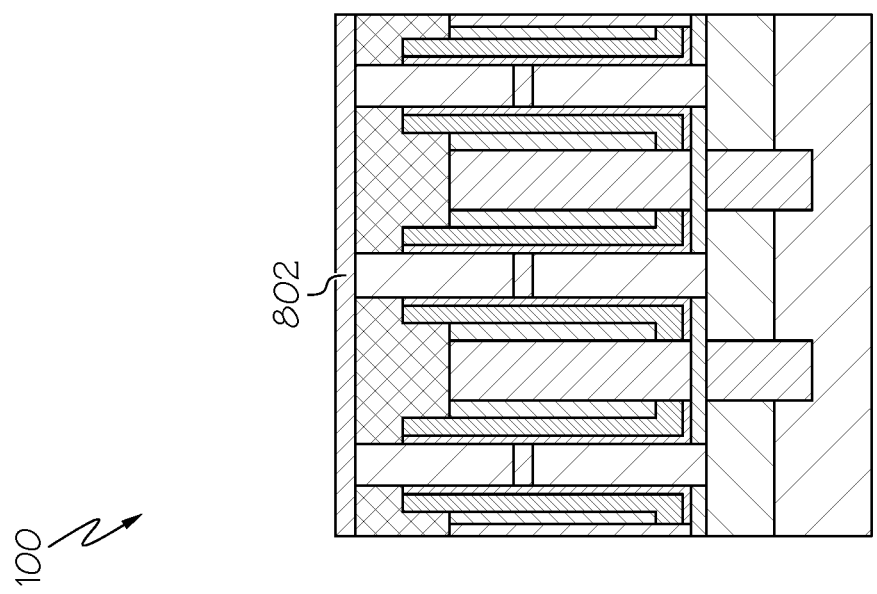
FIG. 9A is a cross-sectional side view of the semiconductor structure at a subsequent step in the semiconductor fabrication method.

A SiN protective layer 802 which is also referred to as a hard mask, as shown in FIGS. 9A and 9B, is deposited on top of the fins 102, 104. Then, as shown in FIGS. 10A and 10B, an OPL patterning hard mask 902 is selectively deposited over certain fins 102, 104, and the SiN protective layer 802 is removed from the top of the other fins 102, 104. The OPL patterning hard mask 902 can be used to form pFETs (vertical FETs) separate from nFETs (vertical FETs) in the fins 102, 104.

The a-Si material 128 is then removed (pulled) from the top of the fin hard mask, leaving recesses 1002, 1004, 1006, 1008, on the exposed fins 102, 104, as shown in FIGS. 11A and 11B. The SiC 702 is also slightly reduced, as shown in FIGS. 12A and 12B, thereby exposing the high-K dielectric $HfO_2$ 202, the WFM 204, and the protective SiN 206, at the top of each of the fins 102, 104, that is not covered by the OPL hard mask 902.

Figure 13B:
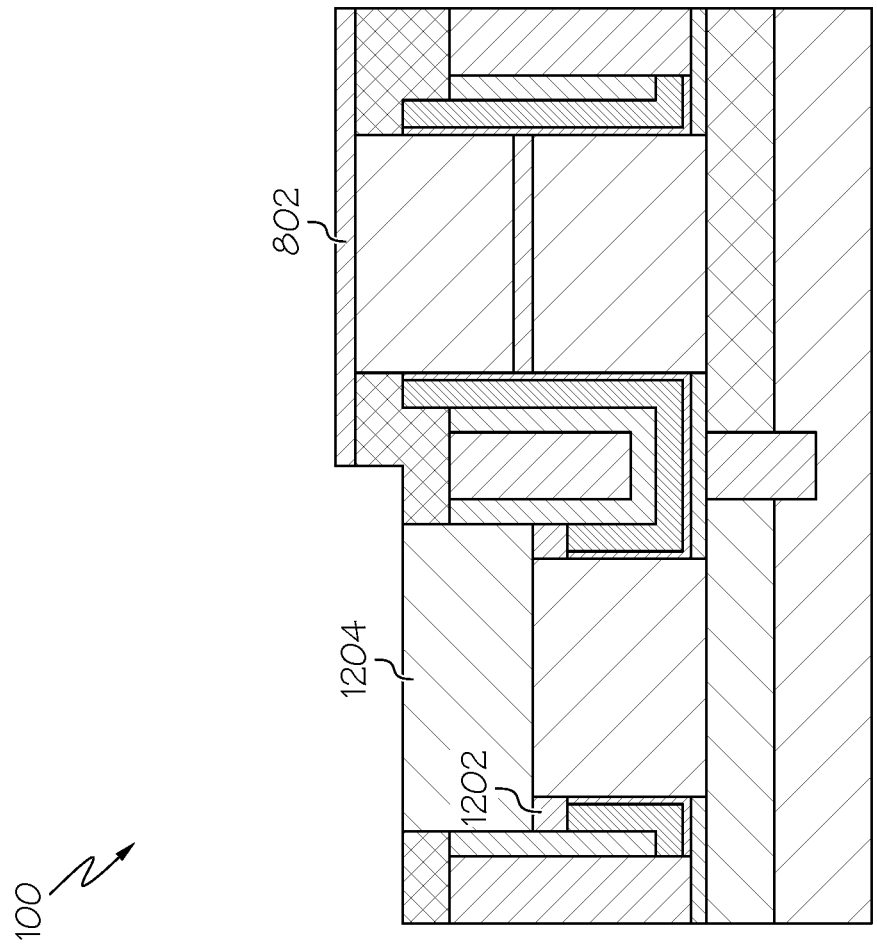
FIG. 13B is a cross-sectional side view of the semiconductor structure at the same subsequent step in the semiconductor fabrication method as in FIG. 13A.
Figure 13A:
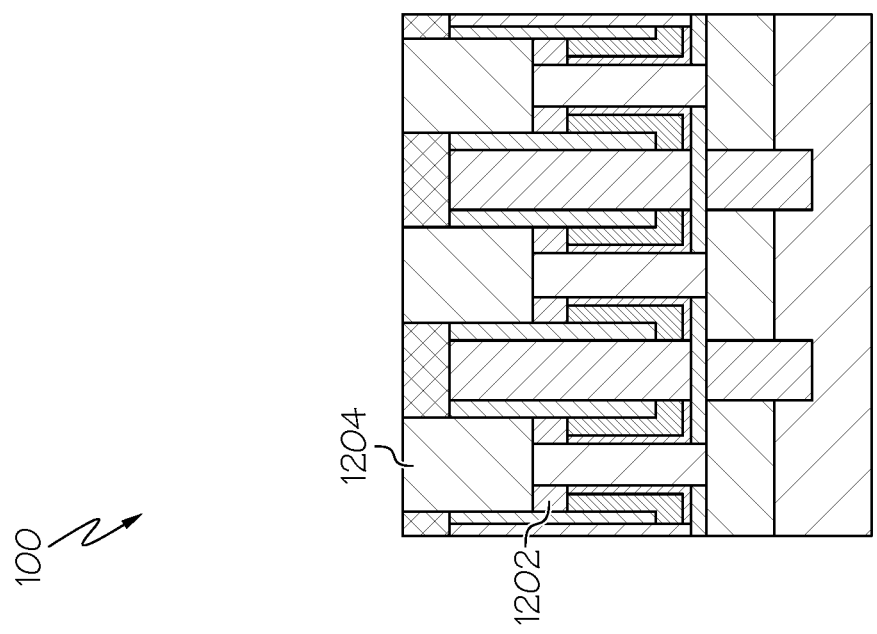
FIG. 13A is a cross-sectional side view of the semiconductor structure at a subsequent step in the semiconductor fabrication method, according to one embodiment of the invention.

The example fabrication method continues by performing an LGR process, such as using an isotropic etch, that removes the WFM 204 and the high-K dielectric $HfO_2$ 202, from the sides of the exposed fins 102, 104, and removes the SiO 126 from the top of the fin 102, 104, creating a recess on top of the fin 102, 104, and adjacent to, and contacting, the protective SiN 206, as shown in FIGS. 13A and 13B. Additionally, according to the example method, a low-K dielectric top spacer layer (top spacer) 1202 is deposited on top of the exposed WFM 204 and the exposed high-K dielectric $HfO_2$ 202 adjacent to, and contacting the sidewall of the exposed fin 102, 104. The top spacer 1202 may also be referred to as a top gate spacer, which isolates a respective gate region from a top source/drain epi region of each VFET. The top spacer 1202 may be formed by depositing a conformal dielectric material layer, and anisotropically etching the conformal dielectric material layer. The conformal dielectric material layer 1202 may include, for example, silicon nitride, silicon oxide, and/or dielectric metal oxide. A top junction (top source/drain epi region) 1204 is then formed (epitaxially grown) directly on top of, and contacting, the fin 102, 104, and on top of, and contacting, the top spacer 1202, as shown in FIGS. 13A and 13B. The fabrication process can be followed to form first one type of VFET for a first set of fins (with a junction arrangement 1204, 114, e.g., PNP), and then the SiN protective layer 802 can be deposited on top of the first set of fins and the SiN protective layer 802 can be removed from the top of a second set of fins, for which the process as discussed above can be similarly followed to form a second type of VFET (with a different junction arrangement 1302, 116, e.g., NPN) for the second set of fins, or the process can be performed vice versa (e.g., first PNP followed by NPN), as shown in FIG. 14A and FIG. 14B.

Figure 15B:
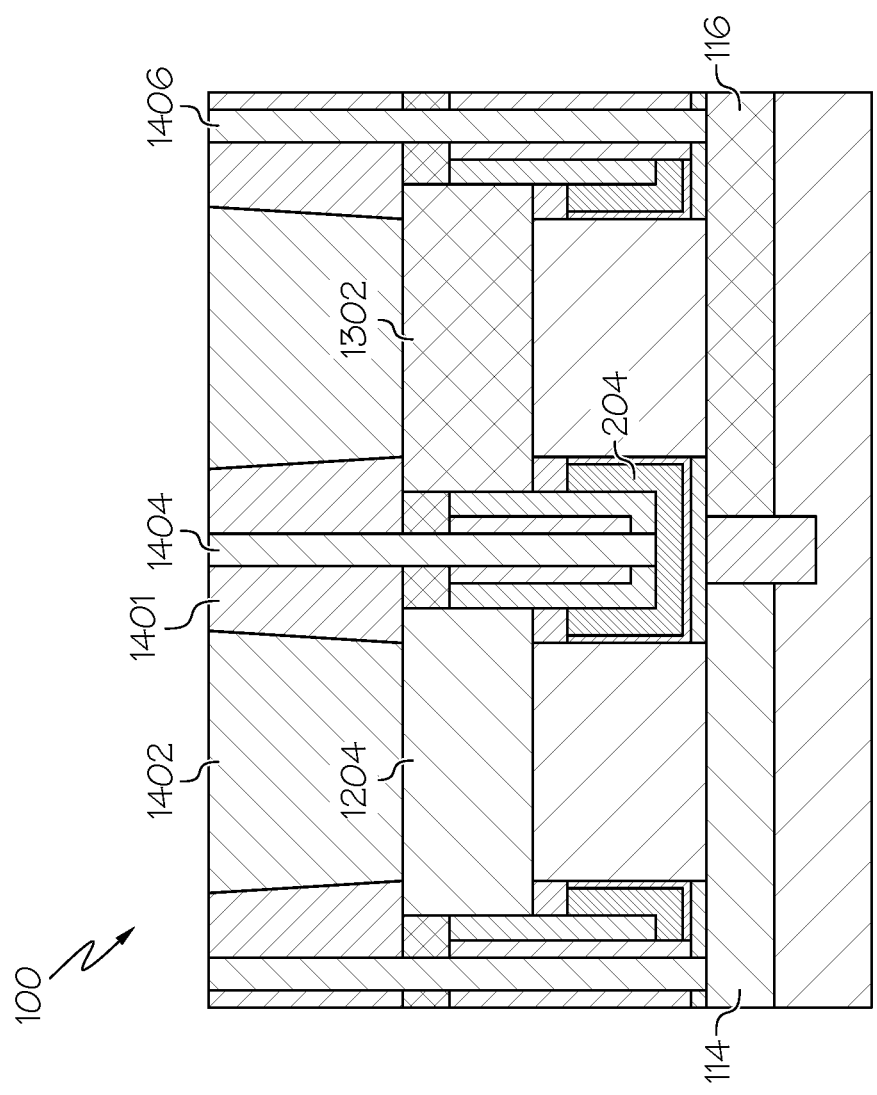
FIG. 15B is a cross-sectional side view of the semiconductor structure at the same subsequent step in the semiconductor fabrication method as in FIG. 15A.
Figure 15A:
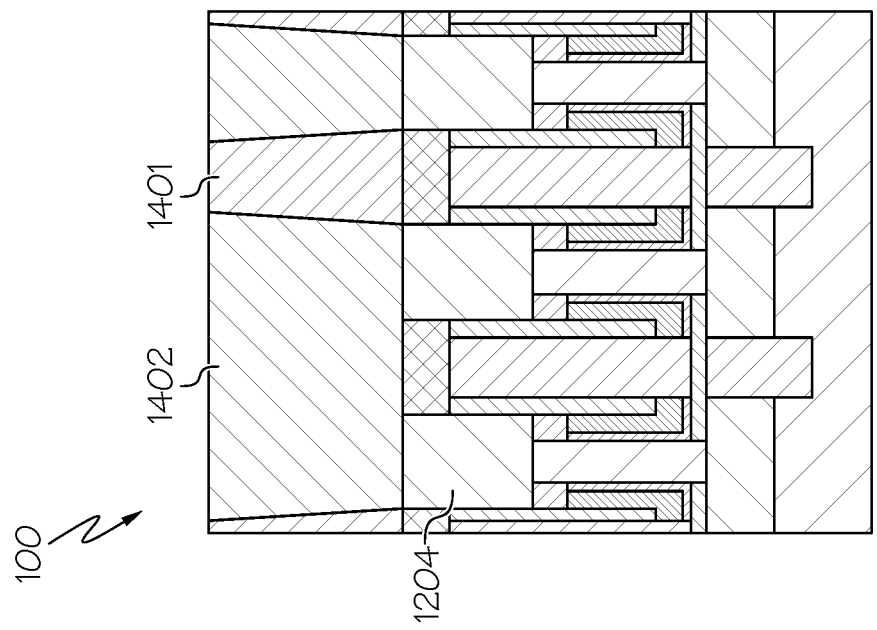
FIG. 15A is a cross-sectional side view of the semiconductor structure at a subsequent step in the semiconductor fabrication method, according to the one embodiment of the invention.

Then, as shown in FIG. 15A and FIG. 15B, according to one embodiment a set of top metal contacts 1402, 1404, 1406, separated by dielectric material 1401, can be formed as part of an MOL metallization layer on top of the VFETs. A top source/drain metal (or another conductive material) contact 1402, for example, can be formed on top of the top source/drain epi region 1204 of a VFET. A top gate metal contact 1404 can be formed near to an active region of a VFET by etching a trench and filling it with metal (or another conductive material) to land on, and/or contact directly, an exposed WFM region 204 nearby one or more fins of VFETs. The top gate metal contact 1404 can be formed by etching down to the particular region where the WFM region 204 will be exposed, without concern of breaking a hole through the adjacent SiC protective layer near the top source/drain epi region 1204, 1302, of one or more VFETs and possibly shorting the top gate metal contact 1404 to an adjacent structure. A bottom source/drain metal (or another conductive material) contact 1406 can be formed near to the active region of a VFET. The bottom source/drain metal contact 1406 can be formed by etching down to the particular region where the bottom source/drain epi region 116 will be exposed, without concern of breaking a hole through the adjacent SiC protective layer near the top source/drain epi region 1204, 1302, of one or more VFETs and possibly shorting the bottom source/drain metal contact 1406 to an adjacent structure.

Figure 16B:
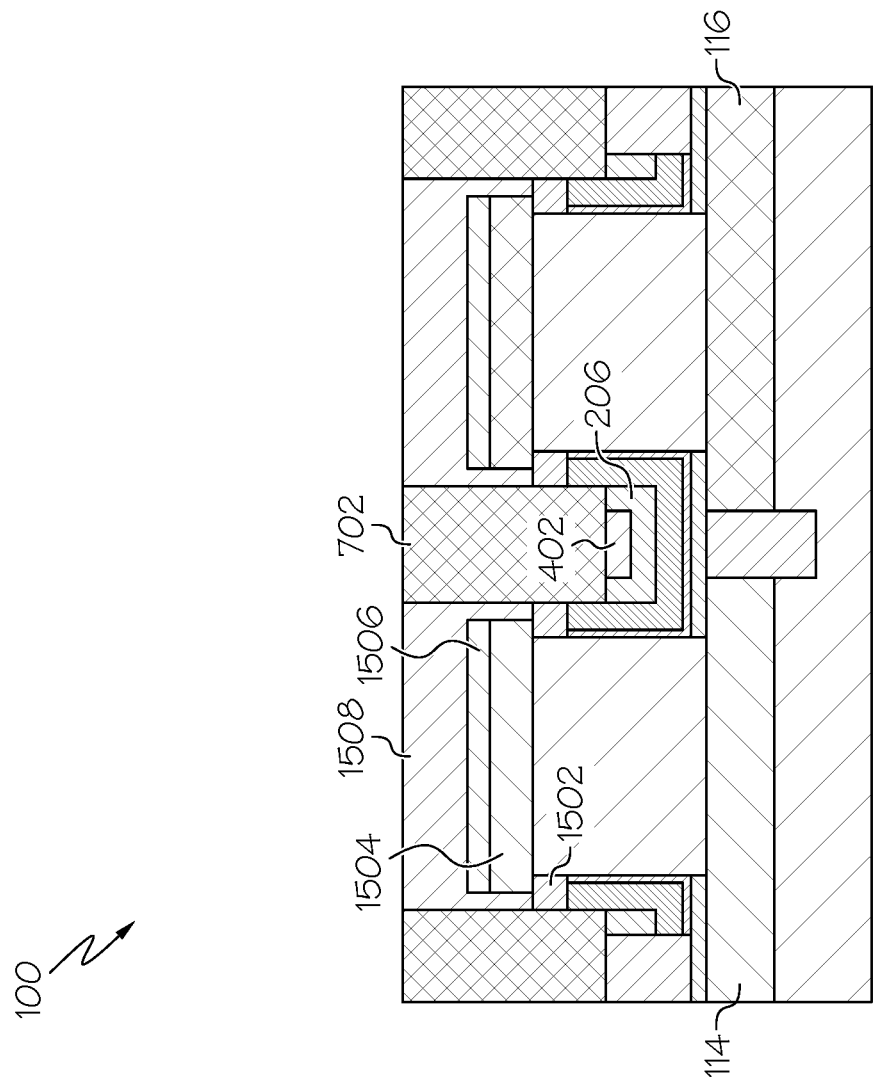
FIG. 16B is a cross-sectional side view of the semiconductor structure at the same subsequent step in the semiconductor fabrication method as in FIG. 16A.
Figure 16A:
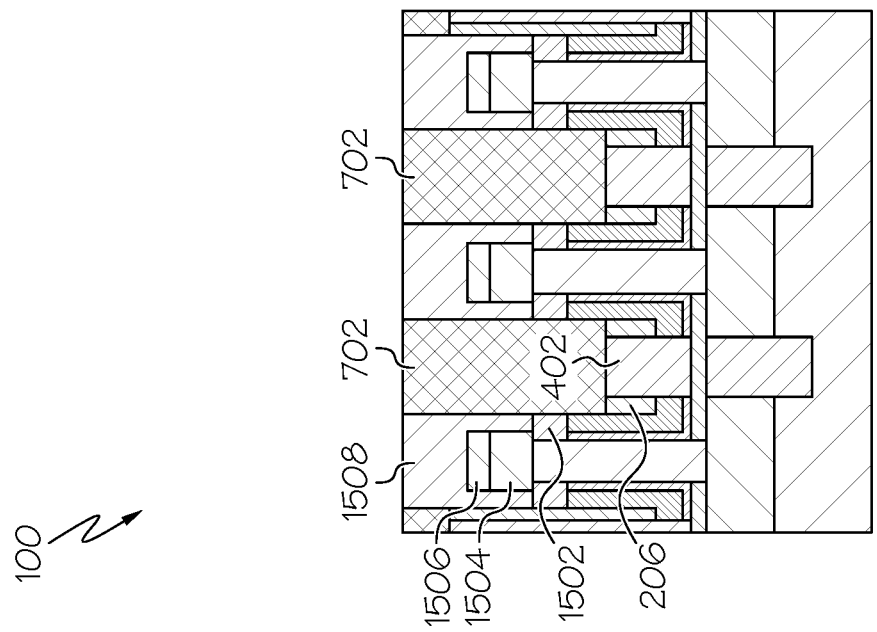
FIG. 16A is a cross-sectional side view of the semiconductor structure at a subsequent step in the semiconductor fabrication method, according to another embodiment of the invention.

FIGS. 16A and 16B illustrate another embodiment of the invention in which the SiC upper ILD region 702 between VFET fins is made much deeper than the SiC upper ILD region 702 in the embodiment discussed above with reference to FIGS. 12A and 12B to 15A and 15 B.

In this another example embodiment, shown in FIGS. 16A and 16B, the SiC upper ILD region 702 between VFET fins is made deeper directly on top of, and contacting, the SiO material of the lower ILD region 402, than the depth of the SiC upper ILD region 702 in the embodiment discussed above with reference to FIGS. 12A and 12B to 15A and 15 B. That is, the SiC upper ILD region 702, according to this another embodiment, is deposited into a trench that was etched in the oxide 402 down to a height of a middle portion of the fin of the VFETs, and below a level where the top source/drain epi region 1504 and the top spacer 1502 will be formed for the VFETs.

According to the example, an oxide etch on the oxide fill 402 is performed to create the recesses 502, 504, 506, 508, 510, in the oxide 402, similar to the discussion above with reference to FIGS. 6A and 6B. However, the recesses 502, 504, 506, 508, 510, in the oxide 402 are etched much deeper down to a height for the oxide 402 that is at a level in the middle of the fins 102, 104. A fabrication method is then performed similar to that discussed above with respect to FIGS. 7A and 7B to 12A and 12B, with the silicon carbide (SiC) fill on top of the oxide 402 being a much deeper fill forming a second ILD 702 on, and contacting the oxide 402 of the first ILD.

Then, as shown in FIGS. 16A and 16B, the low-K dielectric top spacer layer (top spacer) 1502 is deposited on top of the exposed WFM 204 and the exposed high-K dielectric HfO$_2$ 202 adjacent to, and contacting the sidewall of the exposed fin 102, 104. A top junction (top source/drain epi region) 1504 is then formed (epitaxially grown) directly on top of, and contacting, the fin 102, 104, and on top of, and contacting, the top spacer 1502. However, the top source/drain epi region 1504 is grown to fill only a portion of, and less than an entire, cavity of SiN 1508. A metal cap 1506 is then formed directly on, and contacting, the top source/drain epi region 1504, followed by a filling the rest of the cavity with silicon nitride to form a SiN cap 1508.

Figure 17B:
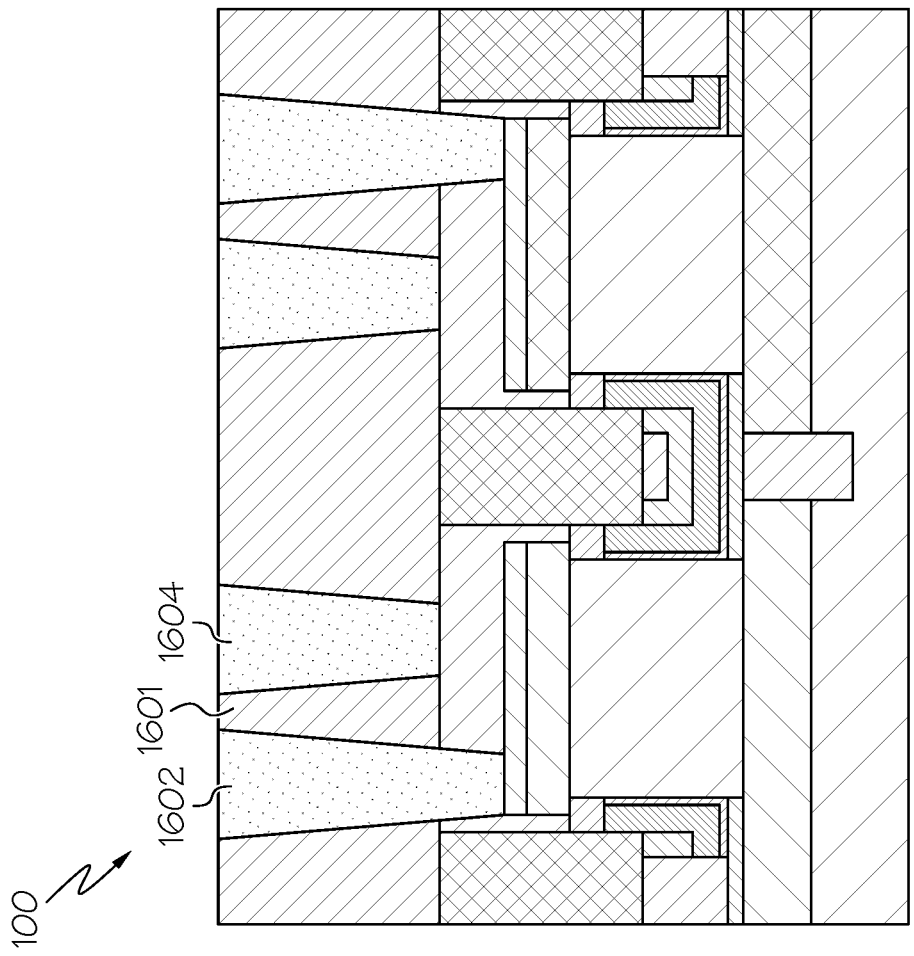
FIG. 17B is a cross-sectional side view of the semiconductor structure at the same subsequent step in the semiconductor fabrication method as in FIG. 17A.
Figure 17A:
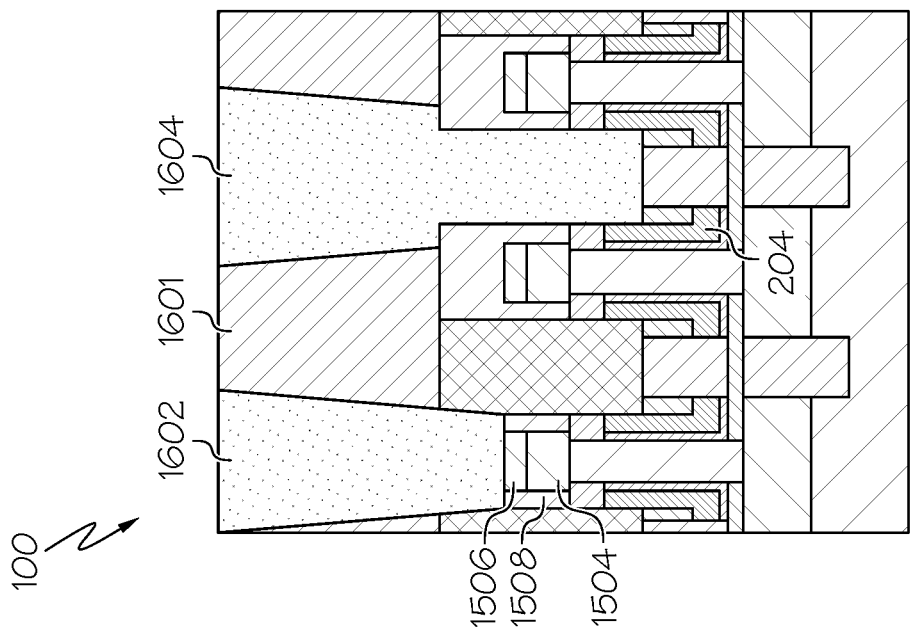
FIG. 17A is a cross-sectional side view of the semiconductor structure at a subsequent step in the semiconductor fabrication method, according to the other embodiment of the invention.

Then, as shown in FIG. 17A and FIG. 17B, according to the another embodiment, a set of top metal contacts 1602, 1604, separated by dielectric material 1601, can be formed as part of an MOL metallization layer on top of the VFETs. A top source/drain metal (or another conductive material) contact 1602, for example, can be formed on top of the top source/drain epi region 1504 of a VFET. A top gate metal contact 1604 can be formed very near to, or on top of, an active region of a VFET by etching a trench and filling it with metal (or another conductive material) to land on, and/or contact directly, an exposed WFM region 204 nearby one or more fins of VFETs. The top gate metal contact 1604 can be formed by etching down to the particular region where the WFM region 204 will be exposed, without concern of breaking a hole through the adjacent SiC protective layer near the top source/drain epi region 1504 of one or more VFETs and possibly shorting the metal contact to an adjacent structure. The SiN protective cap 1508 and the metal cap 1506, along with the adjacent ILD SiC 702, protect the top source/drain epi region 1504 from any concern of breaking a hole through the caps 1506, 1508, or through the adjacent ILD SiC protective layer 702 that extends protection down through the height of the top source/drain epi region 1504 of the VFET. A gate metal contact 1604 can be formed right next to, or on top of, the active region of the fins 102, 104, while reliably avoiding creating a short circuit to the source/drain epi region 1504. The gate metal contact 1604 can be placed in between fins 102, 104, without concern, which was not possible in the past.

Figure 18:
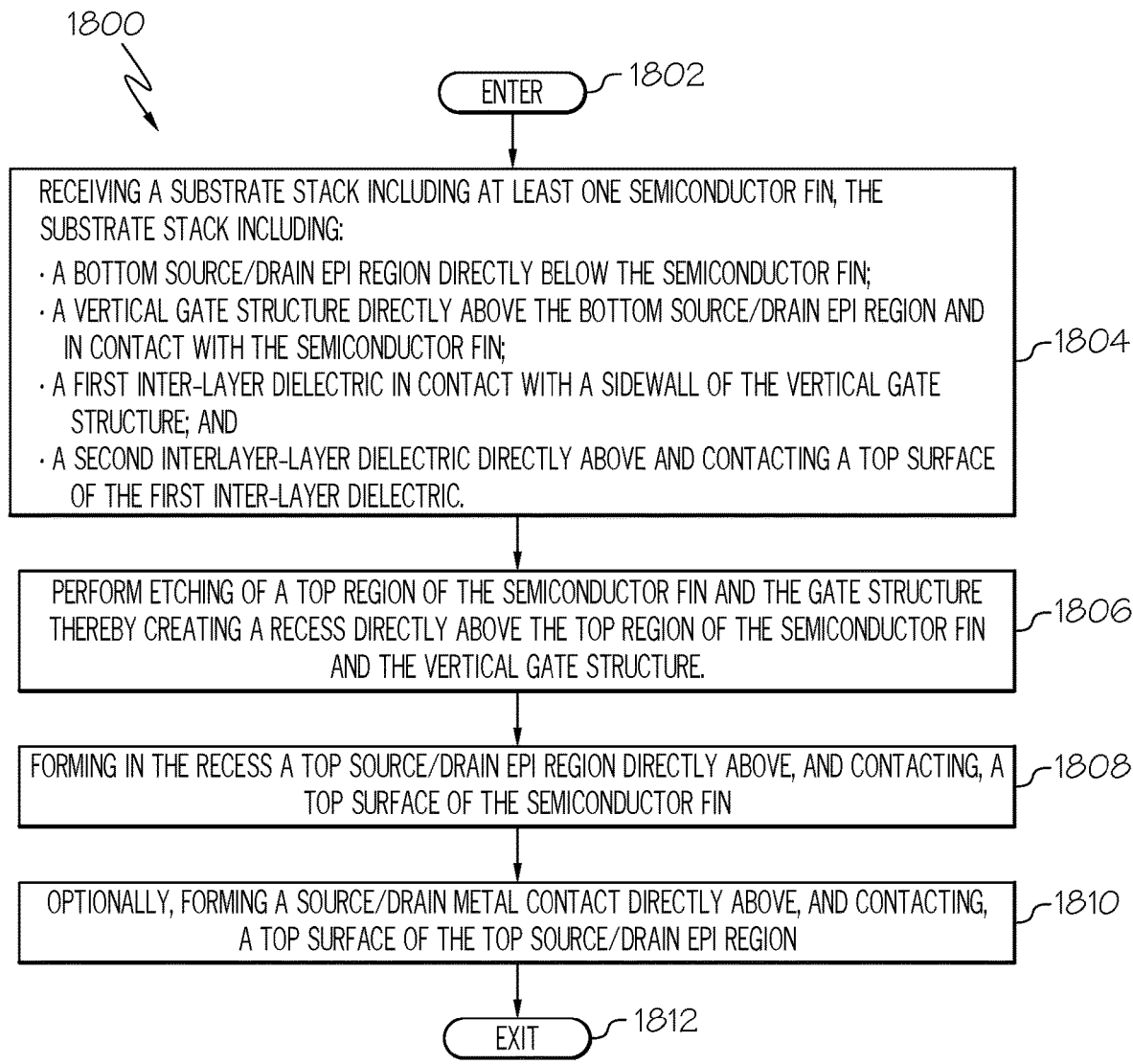
FIG. 18 is an operational flow diagram illustrating one example of a process for forming a semiconductor device according an embodiment of the present invention.

Referring now to FIG. 18, an operational flow diagram illustrates one example of a semiconductor device fabrication method 1800 according to an embodiment of the present invention. It should be noted that each of the steps shown in FIG. 18 has been discussed in greater detail above with respect to the previous figures.

The method for fabrication of the semiconductor device 100 is entered, at step 1802, and proceeds to receiving a substrate stack, at step 1804. Specifically, a substrate stack is received, at step 1804. The substrate stack includes at least one semiconductor fin 102, 104. The substrate stack includes: a bottom source/drain epi region 108 directly below the semiconductor fin 102, 104. A vertical gate structure is disposed directly above the bottom source/drain epi region 108, and in contact with the semiconductor fin 102, 104. A first inter-layer dielectric (ILD) 402 is in contact with a sidewall of the vertical gate structure. A second interlayer-layer dielectric (ILD) 702 is disposed directly above, and contacting, a top surface of the first inter-layer dielectric 402.

According to the example method, etching of a top region of the semiconductor fin 102, 104, and the gate structure, is performed, at step 1806, thereby creating a recess directly above the top region of the semiconductor fin 102, 104, and the vertical gate structure. The method continues by forming, at step 1808, in the recess a top source/drain epi region 1204, 1504, directly above, and contacting, a top surface of the semiconductor fin 102, 104. Then, optionally, the fabrication method forms a source/drain metal contact 1402, 1506, 1602 directly above, and contacting, a top surface of the top source/drain epi region 1204, 1504.

Although specific embodiments of the invention have been discussed, those having ordinary skill in the art will understand that changes can be made to the specific embodiments without departing from the scope of the invention.

The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for forming a semiconductor device structure, the method comprising:
    receiving a substrate stack including at least one semiconductor fin, the substrate stack including:
        a bottom source/drain epi region directly below the semiconductor fin;
        a vertical gate structure directly above the bottom source/drain epi region and in contact with the semiconductor fin;
        a first inter-layer dielectric in contact with a sidewall of the vertical gate structure; and
        a second interlayer-layer dielectric directly above and contacting a top surface of the first inter-layer dielectric;
    etching a top region of the semiconductor fin and the gate structure thereby creating a recess directly above the top region of the semiconductor fin and the vertical gate structure; and forming in the recess at least a top source/drain epi region directly above, and contacting, a top surface of the semiconductor fin, and wherein the vertical gate structure comprises:
        a bottom spacer directly above, and contacting, a top surface of the bottom source/drain epi region;
        a high-K dielectric layer directly above the bottom spacer and horizontally adjacent to, and contacting, a vertical sidewall of the semiconductor fin;
        a gate work function metal layer horizontally adjacent to, and contacting, the high-K dielectric layer; and
    the method comprising:
        etching the top region of the semiconductor fin, the high-K dielectric layer, and the gate work function metal layer, thereby creating the recess directly above the top region of the semiconductor fin, the high-K dielectric layer, and the gate work function metal layer, and horizontally adjacent to at least the second inter-layer dielectric; and wherein the etching creating the recess horizontally adjacent to at least the second inter-layer dielectric and the first inter-layer dielectric.

2. The method of claim 1, further comprising:
    forming in the recess a top spacer directly above, and contacting, a top surface of the high-K dielectric layer and the gate work function metal layer, and horizontally adjacent to, and contacting, a vertical sidewall of the semiconductor fin; and
    forming in the recess the top source/drain epi region directly above, and contacting, the top surface of the semiconductor fin and a top surface of the top spacer.

3. The method of claim 2, further comprising:
    forming a source/drain metal contact directly above, and contacting, a top surface of the top source/drain epi region.

4. The method of claim 3, further comprising:
    vertical reactive ion etching at least the second interlayer-layer dielectric to form a trench that exposes a surface of the gate work function metal layer; and
    filling the trench with metal to form a gate metal contact contacting the surface of the gate work function metal layer exposed in the trench.

5. The method of claim 4, wherein the vertical reactive ion etching comprises etching through the second interlayer-layer dielectric and in the first inter-layer dielectric to form the trench that exposes the surface of the gate work function metal layer; and
    the method comprising:
        filling the trench with metal to form the gate metal contact contacting the surface of the gate work function metal layer exposed in the trench.

6. The method of claim 1, further comprising:
    forming in the recess:
        a top spacer directly above, and contacting, a top surface of the high-K dielectric layer and the gate work function metal layer, and horizontally adjacent to, and contacting, a vertical sidewall of the semiconductor fin;
        the top source/drain epi region directly above, and contacting, the top surface of the semiconductor fin and a top surface of the top spacer;
        a local top metallization layer directly above, and contacting, a top surface of the top source/drain epi region; and
        a silicon nitride cap directly above, and contacting, a top surface of the local top metallization layer, and horizontally adjacent to, and contacting, a vertical sidewall of the local top metallization layer and a vertical sidewall of the top source/drain epi region.

7. The method of claim 6, further comprising:
    vertical reactive ion etching the silicon nitride cap to form a first trench that exposes the top surface of the local top metallization; and
    filling the first trench with metal to form a source/drain metal contact contacting the top surface of the local top metallization layer exposed in the trench.

8. The method of claim 7, further comprising:
    vertical reactive ion etching at least the second interlayer-layer dielectric to form a second trench that exposes a surface of the gate work function metal layer; and
    filling the second trench with metal to form a gate metal contact contacting the surface of the gate work function metal layer exposed in the trench.

* * * * *